(12) United States Patent
Makino et al.

(10) Patent No.: US 8,938,135 B2
(45) Date of Patent: Jan. 20, 2015

(54) METHOD FOR MANUFACTURING OPTICAL WAVEGUIDE AND OPTICAL WAVEGUIDE MANUFACTURED BY THE METHOD

(75) Inventors: Tatsuya Makino, Ibaraki (JP); Masatoshi Yamaguchi, Ibaraki (JP); Atsushi Takahashi, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 1105 days.

(21) Appl. No.: 12/678,547

(22) PCT Filed: Sep. 18, 2008

(86) PCT No.: PCT/JP2008/066824
§ 371 (c)(1),
(2), (4) Date: Mar. 17, 2010

(87) PCT Pub. No.: WO2009/038114
PCT Pub. Date: Mar. 26, 2009

(65) Prior Publication Data
US 2010/0209042 A1 Aug. 19, 2010

(30) Foreign Application Priority Data

Sep. 19, 2007 (JP) ................................. 2007-242218
Sep. 19, 2007 (JP) ................................. 2007-242219
Mar. 10, 2008 (JP) ................................. 2008-060094
Mar. 10, 2008 (JP) ................................. 2008-060095

(51) Int. Cl.
*G02B 6/12* (2006.01)
*G02B 1/12* (2006.01)
(Continued)

(52) U.S. Cl.
CPC ................ *G02B 6/138* (2013.01); *G02B 6/136* (2013.01); *G03F 7/322* (2013.01)
USPC ........................................... 385/14; 264/1.27

(58) Field of Classification Search
CPC .......... G02B 6/42; G02B 6/43; G02B 6/4214; G02B 6/12004; G02B 6/12007; G02B 6/1221

USPC ............................................. 385/14; 264/1.27
See application file for complete search history.

(56) References Cited

U.S. PATENT DOCUMENTS 5,637,443 A 6/1997 Yoshida et al.
6,905,904 B2 * 6/2005 Gardner et al. ................. 438/31
(Continued)

FOREIGN PATENT DOCUMENTS

EP 1818366 8/2007
JP 63-081301 4/1988
(Continued)

OTHER PUBLICATIONS

Extended European Search Report dated Apr. 21, 2011, including Supplemental European Search Report and European Search Opinion, for EP Application No. 08832369.6-1524/2189826 PCT/JP2008/066824.

*Primary Examiner* — Jerry Blevins
(74) *Attorney, Agent, or Firm* — Antonelli, Terry, Stout & Kraus, LLP.

(57) ABSTRACT

The present invention relates to a production process for an optical waveguide comprising a step for forming a photosensitive resin layer comprising a photosensitive resin composition on a substrate, a step for exposing a desired pattern and a step for carrying out development in an alkaline developer containing a divalent or higher-valent metal ion and a production process for an optical waveguide comprising a step for forming a photosensitive resin layer comprising a photosensitive resin composition on a substrate, a step for exposing a desired pattern, a step for carrying out development in an alkaline developer and a step for carrying out washing with a cleaning liquid containing a divalent or higher-valent metal ion or an acid aqueous solution.

Capable of being provided are a production process for an optical waveguide which is excellent in a transparency and a reliability and an optical waveguide produced by the above production process.

27 Claims, 1 Drawing Sheet

(51) Int. Cl.
*G02B 6/138* (2006.01)
*G02B 6/136* (2006.01)
*G03F 7/32* (2006.01)

(56) References Cited

U.S. PATENT DOCUMENTS

| | | | |
|---|---|---|---|
| 8,351,752 B2 * | 1/2013 | Shibata et al. | 385/132 |
| 2003/0026565 A1 * | 2/2003 | Anderson et al. | 385/123 |
| 2004/0023159 A1 * | 2/2004 | Sakayori | 430/283.1 |
| 2004/0253540 A1 * | 12/2004 | Yoshida et al. | 430/281.1 |
| 2006/0018615 A1 * | 1/2006 | Imai | 385/129 |
| 2006/0110907 A1 * | 5/2006 | Sakurai et al. | 438/612 |
| 2006/0178481 A1 * | 8/2006 | Matsuoka et al. | 525/199 |
| 2006/0249304 A1 | 11/2006 | Tanaka et al. | |
| 2007/0104440 A1 * | 5/2007 | Kim et al. | 385/129 |
| 2010/0232744 A1 * | 9/2010 | Asai et al. | 385/14 |

FOREIGN PATENT DOCUMENTS

| | | |
|---|---|---|
| JP | 06-258537 | 9/1994 |
| JP | 07-036196 | 2/1995 |
| JP | 09-311458 | 12/1997 |
| JP | 2002-162739 | 6/2002 |
| JP | 2003-195079 | 7/2003 |
| JP | 2006-030919 | 2/2006 |
| JP | 2006-039154 | 2/2006 |
| JP | 2007-071966 | 3/2007 |
| WO | WO 2005/006825 A1 | 1/2005 |

* cited by examiner

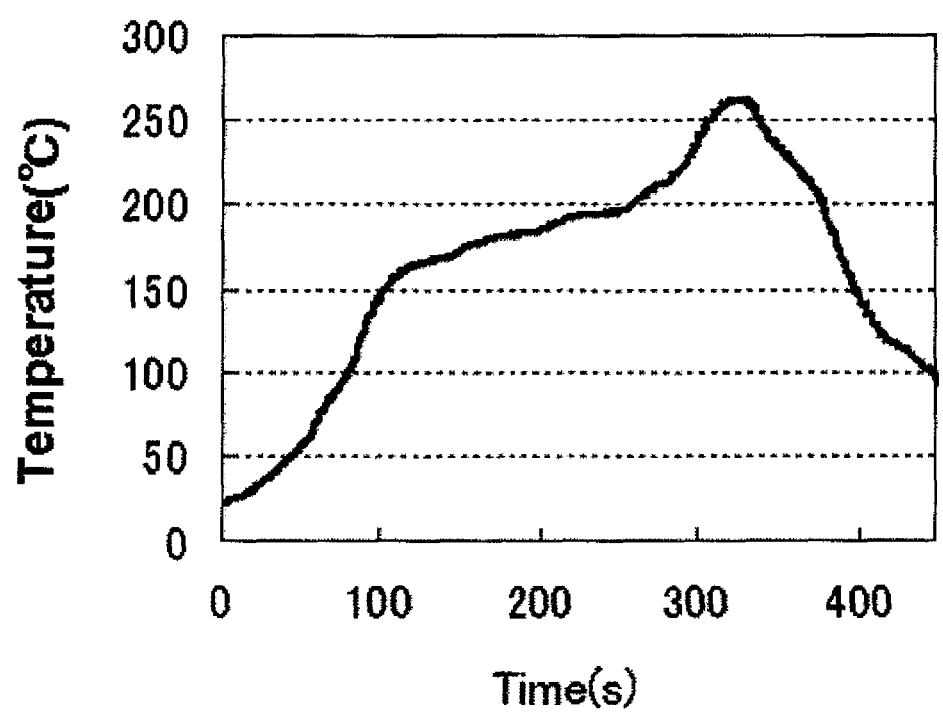

METHOD FOR MANUFACTURING OPTICAL WAVEGUIDE AND OPTICAL WAVEGUIDE MANUFACTURED BY THE METHOD

BACKGROUND OF THE INVENTION

The present invention relates to a production process for an optical waveguide and an optical waveguide, specifically to a production process for an optical waveguide comprising a step for forming a photosensitive resin layer on a substrate, a step for exposing a desired pattern and a step for carrying out development in an alkaline developer and an optical waveguide obtained by the above production process.

RELATED ART

In recent years, in high speed & high density signal transmission between electronic devices and between wiring boards, transmission through conventional electric wirings is restricted in a rise in a speed and a density due to barriers brought about by mutual interference and attenuation of signals. In order to break through the above barriers, a technique for connecting electronic devices and wiring boards with each other by means of light, so-called optical interconnection is investigated. A polymer optical waveguide attracts attentions as an optical transmission line in terms of easier processing, a lower cost, a higher freedom of wirings and a possible rise in a density.

A type in which a polymer optical waveguide is prepared on a glass epoxy resin substrate assuming that it is applied to a photoelectric mixed board and a flexible type having no hard support base assuming that boards are connected with each other are considered to be suitable for the form of the polymer optical waveguide.

A process for forming a core pattern by exposure and development is known as one of processes for forming simply an optical waveguide at a high precision. In this connection, an exposing process is a step in which a photosensitive resin in a light irradiated part is three-dimensionally cross-linked and insolubilized, and a developing process is a step in which a photosensitive resin in an unexposed part, that is, an unreacted part is dissolved in a developer and removed.

A method in which an organic solvent is used as a developer has so far been known (refer to, for example, a patent document 1), and methods in which an alkaline developer is used to carry out development from the viewpoints of a safety of a developing process and a load exerted on the environment are proposed as well (refer to, for example, patent documents 2 and 3).

A functional group showing an acidity such as a carboxyl group, a phenolic hydroxyl group and the like is introduced into a material for forming an optical waveguide to which an alkali developing process can be applied in order to make the material soluble in an alkaline developer. Accordingly, an acid functional group is neutralized by an alkaline developer as well in a core pattern insolubilized by exposure to form a salt. In particular, when used is an alkaline developer containing an alkali metal compound such as sodium carbonate, potassium carbonate, sodium hydroxide, potassium hydroxide and the like or an organic base such as tetramethylammonium hydroxide and the like, a monovalent salt produced tends to be chemically instable.

A core pattern in which an instable salt remains assumes an uneven structure in an inside thereof, and therefore not only it is not preferred from the viewpoint of a high transparency (low optical propagation loss), but also it is not preferred as well from the viewpoint of a reliability of the optical waveguide.

Patent document 1: Japanese Patent Application Laid-Open No. 81301/1988
Patent document 2: Japanese Patent Application Laid-Open No. 258537/1994
Patent document 3: Japanese Patent Application Laid-Open No. 195079/2003

DISCLOSURE OF THE INVENTION

The present invention has been made in order to solve the problems described above, and an object thereof is to provide a production process for an optical waveguide which is excellent in a transparency and a reliability and an optical waveguide produced by the above production process.

Intensive investigations repeated by the present inventors have resulted in finding that the problems described above can be solved by forming an optical waveguide by allowing a divalent or higher-valent metal ion to be present in a developing step and/or a washing step after development or passing through a step for washing with an acid aqueous solution after carrying out development with an alkaline developer.

That is, the present invention provides:
(1) a production process for an optical waveguide comprising a step for forming a photosensitive resin layer comprising a photosensitive resin composition on a substrate, a step for exposing a desired pattern and a step for carrying out development in an alkaline developer containing a divalent or higher-valent metal ion,
(2) a production process for an optical waveguide comprising a step for forming a photosensitive resin layer comprising a photosensitive resin composition on a substrate, a step for exposing a desired pattern, a step for carrying out development in an alkaline developer and a step for carrying out washing with a cleaning liquid containing a divalent or higher-valent metal ion or an acid aqueous solution and
(3) the production process for an optical waveguide as described in the above item (2), wherein a divalent or higher-valent metal ion is contained in the alkaline developer of the developing step described above.

According to the production process of the present invention, an instable monovalent salt remaining in a core pattern can effectively be converted to a divalent or higher salt or can effectively be returned to a stable acid functional group, and as a result thereof, an optical waveguide which is excellent in a transparency and a reliability can be obtained at a high productivity.

BRIEF EXPLANATION OF THE DRAWING

FIG. 1 is a graph showing a temperature profile in a reflow furnace in a reflow test carried out in the present invention.

BEST MODE FOR CARRYING OUT THE INVENTION

The production process for an optical waveguide and the optical waveguide according to the present invention shall be explained below in details.

The production process of the present invention for an optical waveguide comprises at least a step for forming a photosensitive resin layer comprising a photosensitive resin composition on a substrate, a step for exposing a desired pattern and a step for carrying out development in an alkaline developer and comprises, if necessary, a washing step.

The production process of the present invention is characterized by allowing a divalent or higher-valent metal ion to be present in at least one of the developing step and the washing step after development or carrying out washing with an acid aqueous solution after alkali development.

To be specific, the following four embodiments are preferably available. That is, they are (a) a production process for an optical waveguide comprising a step for forming a photosensitive resin layer for forming an optical waveguide on a substrate, a step for exposing a desired pattern after forming the resin layer and a step for carrying out development in an alkaline developer containing a divalent or higher-valent metal ion after the exposure, (b) a production process for an optical waveguide comprising a step for forming a photosensitive resin layer for forming an optical waveguide on a substrate, a step for exposing a desired pattern after forming the resin layer, a step for carrying out development in an alkaline developer after the exposure and a step for carrying out washing with a cleaning liquid containing a divalent or higher-valent metal ion after the development, (c) a production process for an optical waveguide comprising a step for forming a photosensitive resin layer for forming an optical waveguide on a substrate, a step for exposing a desired pattern after forming the resin layer, a step for carrying out development in an alkaline developer containing a divalent or higher-valent metal ion after the exposure and a step for carrying out washing with a cleaning liquid containing a divalent or higher-valent metal ion after the development and (d) a production process for an optical waveguide comprising a step for forming a photosensitive resin layer for forming an optical waveguide on a substrate, a step for exposing a desired pattern after forming the resin layer, a step for carrying out development in an alkaline developer containing a divalent or higher-valent metal ion after the exposure and a step for carrying out washing with an acid aqueous solution after the development.

The substrate used in the present invention shall not specifically be restricted and includes a silicon substrate, a glass substrate, a glass epoxy substrate, a plastic substrate, a metal substrate, a substrate provided with a resin layer, a substrate provided with a metal layer, a plastic film, a plastic film provided with a resin layer, a plastic film provided with a metal layer and the like.

A method for forming the photosensitive resin layer on the substrate shall not specifically be restricted and includes, for example, methods for coating a photosensitive resin composition for forming an optical waveguide by a spin coating method, a dip coating method, a spray coating method, a bar coating method, a roll coating method, a curtain coating method, a gravure coating method, a screen coating method, an ink jet coating method and the like.

When the photosensitive resin composition for forming an optical waveguide is a photosensitive resin vanish for forming an optical waveguide which is diluted by a suitable organic solvent, a drying step may be provided, if necessary, after forming the resin layer. The drying method includes, for example, drying by heating, drying under reduced pressure and the like. They may be used in combination if necessary.

Other methods for forming the photosensitive resin layer include a method for forming it using a photosensitive resin film comprising a photosensitive resin composition by a lamination method. Usually, a resin film having a three layer constitution in which a photosensitive resin composition is coated on a support film and in which a protective layer is laminated thereon is suitably used, as described later in details, for the photosensitive resin film.

The method for producing the resin layer by a lamination method using the photosensitive resin film for forming an optical waveguide described above is preferred from the viewpoint of making it possible to provide a production process for an optical waveguide which is excellent in a productivity.

A production process for an optical waveguide in which a photosensitive resin film for forming an optical waveguide is used to form a lower cladding layer, a core part and an upper cladding layer shall be explained below as an example, but the present invention shall by no means be restricted thereby.

First, a photosensitive resin film for forming a lower cladding layer is laminated on the substrate described above in a first step. The lamination method in the first step shall not specifically be restricted and includes, for example, a method for laminating the resin layer by pressing while heating by means of a roll laminator or a flat plate type laminator.

In the present invention, the flat plate type laminator means a laminator in which laminate materials are interposed between a pair of flat plates and in which pressure is applied onto the flat plates to thereby press the laminate materials, and a vacuum pressing type laminator can suitably be used. The heating temperature in the above method is preferably 20 to 130° C., and the pressing pressure is preferably 0.1 to 1.0 MPa, but the above conditions shall not specifically be restricted. When a protective film is present in the resin film for forming a lower cladding layer, the film is laminated after removing the protective film.

The photosensitive resin film for forming a lower cladding layer may be tentatively stuck in advance on the substrate by means of the roll laminator before laminated by means of the vacuum pressing type laminator. In this connection, the resin film is tentatively stuck preferably while pressing from the viewpoint of enhancing an adhesive property and a followability. In pressing, it may be carried out while heating by means of a laminator having a heat roll.

The laminating temperature is preferably 20 to 130° C. If it is 20° C. or higher, an adhesive property between the photosensitive resin film for forming a lower cladding layer and the substrate is enhanced. If it is 130° C. or lower, the resin layer is not too fluid in roll lamination, and the required film thickness is obtained. From the viewpoints described above, the laminating temperature is more preferably 40 to 100° C. The pressure in lamination is preferably 0.2 to 0.9 MPa, and the laminating speed is preferably 0.1 to 3 m/minute, but the above conditions shall not specifically be restricted.

The photosensitive resin film for forming a lower cladding layer which is laminated on the substrate is optically cured, and a support film for the photosensitive resin film for forming a lower cladding layer is removed to form a lower cladding layer.

An irradiation amount of an actinic ray in forming the lower cladding layer is preferably 0.1 to 5 $J/cm^2$, but the above conditions shall not specifically be restricted. When an actinic ray is transmitted through the base material, a double exposing equipment which makes it possible to irradiate both sides with an actinic ray at the same time can be used in order to carry out curing efficiently. Further, it may be irradiated with an actinic ray while heating. Heating treatment of 50 to 200° C. may be carried out, if necessary, as treatment after optically cured.

The photosensitive resin film for forming a core part is laminated on the lower cladding layer in a second step by the same method as in the first step. In this connection, the photosensitive resin film for forming a core part is designed so that it has a higher refractive index than that of the photosensitive resin film for forming a lower cladding layer, and it comprises preferably the photosensitive resin composition which can form a core pattern by an actinic ray.

The core part (core pattern) is exposed in a third step. A method for exposing the core pattern shall not specifically be restricted and includes, for example, a method in which the resin layer is imagewise irradiated with an actinic ray through a negative mask pattern called an art work and a method in which the resin layer is imagewise irradiated directly with an actinic ray using laser direct drawing without passing through a photomask.

A light source of an actinic ray includes, for example, light sources which effectively radiate a UV ray, such as a ultrahigh pressure mercury lamp, a high pressure mercury lamp, a mercury vapor arc lamp, a metal halide lamp, a xenon lamp, a carbon arc lamp and the like. Further, in addition thereto, it includes light sources which effectively radiate a visible light, such as a photographic flood bulb, a sun lamp and the like.

An irradiation amount of an actinic ray in exposing the core pattern is preferably 0.01 to 10 $J/cm^2$. If it is 0.01 $J/cm^2$ or more, the curing reaction sufficiently proceeds, and the core pattern is not lost by a developing step described later. If it is 10 $J/cm^2$ or less, the core pattern is prevented from increasing in a size by excess exposure, and fine core patterns can suitably be formed. From the viewpoints described above, it is more preferably 0.05 to 5 $J/cm^2$, particularly preferably 0.1 to 3 $J/cm^2$.

The core pattern may be exposed via the support film of the photosensitive resin film for forming a core part or after removing the support film.

After-exposure heating may be carried out, if necessary, after exposed from the viewpoint of enhancing a resolution and an adhesive property of the core pattern. Time elapsing from irradiation of a UV ray to after-exposure heating is preferably 10 minutes or shorter. If it is 10 minutes or shorter, active species produced by irradiation of a UV ray are not deactivated. A temperature of the after-exposure heating is preferably 40 to 160° C., and the time is preferably 30 seconds to 10 minutes.

In a fourth step, when exposure is carried out via the support film of the photosensitive resin film for forming a core part, this is removed, and development is carried out in an alkaline developer. The developing method shall not specifically be restricted and includes, for example, a spraying method, a dipping method, a puddling method, a spinning method, a brushing method, a scraping method and the like. Also, the above developing methods may be used, if necessary, in combination.

The alkaline developer shall not specifically be restricted and includes, for example, an alkaline aqueous solution, an alkaline quasi-aqueous developer comprising an alkaline aqueous solution and at least one organic solvent and the like.

A base for the alkaline aqueous solution described above shall not specifically be restricted and includes, for example, alkali metal hydroxides such as lithium hydroxide, sodium hydroxide, potassium hydroxide and the like; alkali metal carbonates such as lithium carbonate, sodium carbonate, potassium carbonate and the like; alkali metal hydrogencarbonates such as lithium hydrogencarbonate, sodium hydrogencarbonate, potassium hydrogencarbonate and the like; alkali metal phosphates such as potassium phosphate, sodium phosphate and the like; alkali metal pyrophosphates such as sodium pyrophosphate, potassium pyrophosphate and the like; sodium salts such as sodium tetraborate, sodium metasilicate and the like; ammonium salts such as ammonium carbonate, ammonium hydrogencarbonate and the like; and organic bases such as tetramethylammonium hydroxide, triethanolamine, ethylenediamine, diethylenetriamine, 2-amino-2-hydroxymethyl-1,3-propanediol, 1,3-diaminopropanol-2-morpholine and the like.

The above bases for the alkaline aqueous solution can be used alone or in combination of two or more kinds thereof.

A pH of the alkaline aqueous solution used for the development is preferably 9 to 14, more preferably 10 to 13. A temperature of the alkaline aqueous solution used for the development is controlled according to a developability of the layer of the photosensitive resin composition for forming an optical waveguide. Further, the alkaline aqueous solution may be mixed with a surfactant, a defoaming agent and the like.

The alkaline quasi-aqueous developer described above shall not specifically be restricted as long as it comprises an alkaline aqueous solution and at least one organic solvent. A pH of the alkaline quasi-aqueous developer is preferably lowered as much as possible as long as the development can sufficiently be carried out, and the pH is preferably 8 to 13, more preferably 9 to 12.

The organic solvent described above shall not specifically be restricted and includes, for example, alcohols such as methanol, ethanol, isopropanol, butanol, ethylene glycol, propylene glycol, diethylene glycol and the like; ketones such as acetone, methyl ethyl ketone, 4-hydroxy-4-methyl-2-pentanone and the like; and polyhydric alcohols such as ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol monobutyl ether and the like.

The above organic solvents can be used alone or in combination of two or more kinds thereof. Usually, a concentration of the organic solvent is preferably 2 to 90% by mass, and a temperature of the alkaline quasi-aqueous developer is controlled according to a developability of the layer of the photosensitive resin composition for forming an optical waveguide.

Further, the alkaline aqueous solution may be mixed with small amounts of a surfactant, a defoaming agent and the like.

In (a) to (c) described above as the embodiments of the present invention, it is an essential requisite that a divalent or higher-valent metal ion is contained in the alkaline developer described above or a cleaning liquid described later in details.

The divalent or higher-valent metal ion shall not specifically be restricted and includes, for example, a magnesium ion, a calcium ion, a zinc ion, a manganese (II) ion, a cobalt (II) ion, an iron (II) ion, a copper (II) ion, an iron (III) ion, an aluminum ion and the like.

Among them, the divalent metal ions are preferred from the viewpoint of a stability of salts prepared from them, and they are particularly preferably magnesium or calcium.

The above metal ions can be used alone or in combination of two or more kinds thereof.

A method for adding the metal ions to the alkaline developer described above shall not specifically be restricted and includes, for example, a method in which mixed or dissolved in the alkaline developer are metal sulfates such as magnesium sulfate, calcium sulfate, zinc sulfate, manganese sulfate, cobalt sulfate, iron sulfate, copper sulfate, aluminum sulfate and the like; metal chlorides such as magnesium chloride, calcium chloride, zinc chloride, manganese chloride, cobalt chloride, iron chloride, copper chloride, aluminum chloride and the like; metal carbonates such as magnesium carbonate, calcium carbonate, zinc carbonate, manganese carbonate, cobalt carbonate, iron carbonate, copper carbonate, aluminum carbonate and the like; and metal hydroxides such as magnesium hydroxide, calcium hydroxide, zinc hydroxide, manganese hydroxide, cobalt hydroxide, iron hydroxide, copper hydroxide, aluminum hydroxide and the like.

Water essentially containing the metal ions described above may be used as the alkaline developer. Such water shall not specifically be restricted and includes, for example, tap water, well water and the like.

An amount of the divalent or higher-valent metal ions contained in the alkaline developer described above is preferably 1 to 50000 ppm by mass. If it is 1 ppm by mass or more, an instable monovalent salt remaining in the core pattern can effectively be converted to a stable divalent or higher salt, and if it is 50000 ppm by mass or less, excess metal ions are prevented from remaining in the core pattern. From the viewpoints described above, the amount is more preferably 10 to 10000 ppm by mass, particularly preferably 30 to 5000 ppm by mass.

Washing with a cleaning liquid comprising water and a divalent or higher-valent metal ion is preferably carried out for treatment after development (the washing step is set as a fifth step). The divalent or higher-valent metal ion shall not specifically be restricted, and the same ones as described above can be used.

Among them, the divalent metal ions are preferred from the viewpoint of a stability of salts prepared from them, and they are particularly preferably magnesium or calcium.

The above divalent metal ions can be used alone or in combination of two or more kinds thereof.

A method for adding the metal ions to water shall not specifically be restricted and includes a method in which the same materials as in adding the metal ions to the alkaline developer described above are mixed or with dissolved in the alkaline developer.

Water essentially containing the metal ions described above may be used as the cleaning liquid. Such water shall not specifically be restricted and includes, for example, tap water, well water and the like.

An amount of the metal ions contained in the cleaning liquid described above is preferably 1 to 50000 ppm by mass. If it is 1 ppm by mass or more, an instable monovalent salt remaining in the core pattern can effectively be converted to a stable divalent or higher salt, and if it is 50000 ppm by mass or less, excess metal ions are prevented from remaining in the core pattern. From the viewpoints described above, the amount is more preferably 10 to 10000 ppm by mass, particularly preferably 30 to 5000 ppm by mass.

Further, the cleaning liquid may be mixed with an organic solvent, a surfactant, a defoaming agent and the like.

Next, in (d) described above as the embodiment of the present invention, it is an essential requisite that a step for carrying out washing with an acid aqueous solution is set after a step for carrying out development in an alkaline developer. The washing method shall not specifically be restricted and includes, for example, a spraying method, a dipping method, a puddling method, a spinning method, a brushing method, a scraping method and the like. Also, the above washing methods may be used, if necessary, in combination.

An acid for the acid aqueous solution described above shall not specifically be restricted and includes, for example, inorganic acids such as sulfuric acid, hydrochloric acid, nitric acid, phosphoric acid and the like; carboxylic acids such as formic acid, acetic acid, malonic acid, succinic acid and the like; and hydroxy acids such as lactic acid, salicylic acid, malic acid, tartaric acid, citric acid and the like. They can be used alone or in combination of two or more kinds thereof. Among them, sulfuric acid is preferred from the viewpoints of a higher acidity, a lower volatility and a smaller oxidation.

A pH of the acid aqueous solution used for washing is preferably more than 0 and 5 or less. If it is more than 0, the acidity and the corrosiveness are not too strong, and if it is 5 or less, an instable monovalent salt remaining in the core pattern can effectively be converted to an original functional group. From the viewpoints described above, a pH of the acid aqueous solution is more preferably 0.1 to 4, particularly preferably 0.3 to 3. A temperature of the acid aqueous solution is controlled according to the pH. Further, the acid aqueous solution may be mixed with an organic solvent, a surfactant, a defoaming agent and the like.

Washing with water or a cleaning liquid comprising water and the organic solvent described above may further be carried out, if necessary, for treatment after washing. The organic solvent can be used alone or in combination of two or more kinds thereof. Usually, a concentration of the organic solvent is preferably 2 to 90% by mass, and a temperature thereof is controlled according to a developability of the layer of the photosensitive resin composition for forming an optical waveguide.

The patterns may further be cured, if necessary, for treatment after washing by heating at 60 to 250° C. or exposing at 0.1 to 1000 mJ/cm$^2$.

In a sixth step, the photosensitive resin film for forming an upper cladding layer is laminated on the lower cladding layer and the core pattern by the same method as in the first step and the second step. In this connection, the photosensitive resin film for forming an upper cladding layer is designed so that it has a lower refractive index than that of the photosensitive resin film for forming a core pattern. Further, a height of the upper cladding layer is preferably higher than that of the core pattern.

Next, the layer (film) of the photosensitive resin composition for forming an upper cladding layer is optically cured by the same method as in the first step to form an upper cladding layer.

An irradiation amount of an actinic ray in forming the upper cladding layer is preferably 0.1 to 30 J/cm$^2$, but the condition shall not specifically be restricted.

When an actinic ray is transmitted through the substrate, a double exposing equipment which makes it possible to irradiate both sides with an actinic ray at the same time can be used in order to carry out curing efficiently. Further, it may be irradiated with an actinic ray while heating at 50 to 200° C. Heating treatment of 50 to 200° C. may be carried out, if necessary, as treatment after optically cured.

After forming the upper cladding layer, the support film can be removed, if necessary, to form an optical waveguide.

The photosensitive resin composition used in the present invention shall be explained below.

The photosensitive resin composition is preferably a resin composition containing a compound having at least one of a carboxyl group and a phenolic hydroxyl group from the viewpoint of developing a desired pattern in an alkaline developer after exposing it.

Among them, it is preferably a photosensitive resin composition for forming an optical material comprising (A) a carboxyl group-containing alkali-soluble polymer, (B) a polymerizable compound and (C) a photopolymerization initiator from the viewpoints of a transparency, a heat resistance and a storing stability.

The component (A) used in the present invention shall be explained below.

The carboxyl group-containing alkali-soluble polymer of the component (A) shall not specifically be restricted and includes, for example, polymers shown by the following (1) to (6).

(1) A carboxyl group-containing alkali-soluble polymer obtained by copolymerizing a compound having a carboxyl group and an ethylenically unsaturated group in a molecule with the other compound having an ethylenically unsaturated group.

(2) A carboxyl group-containing alkali-soluble polymer obtained by partially introducing an ethylenically unsaturated group into a side chain of a copolymer of a compound having a carboxyl group and an ethylenically unsaturated group in a molecule and the other compound having an ethylenically unsaturated group.

(3) A carboxyl group-containing alkali-soluble polymer obtained by reacting a copolymer of a compound having an epoxy group and an ethylenically unsaturated group in a molecule and the other compound having an ethylenically unsaturated group with a compound having a carboxyl group and an ethylenically unsaturated group in a molecule and reacting a hydroxyl group of the copolymer produced with polybasic acid anhydride.

(4) A carboxyl group-containing alkali-soluble polymer obtained by reacting a copolymer of acid anhydride having an ethylenically unsaturated group and the other compound having an ethylenically unsaturated group with a compound having a hydroxyl group and an ethylenically unsaturated group in a molecule.

(5) A carboxyl group-containing alkali-soluble polymer obtained by reacting a polyaddition product of a difunctional epoxy resin and dicarboxylic acid or a difunctional phenol compound with polybasic acid anhydride.

(6) A carboxyl group-containing alkali-soluble polymer obtained by reacting a hydroxyl group of a polyaddition product of a difunctional oxetane compound and dicarboxylic acid or a difunctional phenol compound with polybasic acid anhydride.

Among them, the carboxyl group-containing alkali-soluble polymers shown by (1) to (4) described above are preferred from the viewpoints of a transparency and a solubility in the alkaline developer. These polymers are (meth)acryl polymers having a (meth)acryloyl group. In this connection, the (meth)acryloyl group means an acryloyl group and/or a methacryloyl group, and the (meth)acryl polymers mean polymers obtained by polymerizing acrylic acid, acrylic esters, methacrylic acid, methacrylic esters and derivatives thereof as monomers. The above (meth)acryl polymers may be homopolymers of the monomers described above and may be copolymers obtained by polymerizing two or more kinds of the above monomers. Further, they may be copolymers comprising the monomers described above and, if necessary, monomers having an ethylenically unsaturated group other than a (meth)acryloyl group excluding the monomers described above as long as the effects of the present invention are not damaged. Further, they may be mixtures of plural (meth)acryl polymers.

A weight average molecular weight of the carboxyl group-containing alkali-soluble polymer of the component (A) is preferably 1,000 to 3,000,000. If it is 1,000 or more, a cured matter of the resin composition comprising the same has a sufficiently large strength because of a large molecular weight, and if it is 3,000,000 or less, the component (A) is provided with a good solubility in a developer comprising an alkaline aqueous solution and a good compatibility with the polymerizable compound (B).

From the viewpoints described above, a weight average molecular weight of the component (A) is more preferably 3,000 to 2,000,000, particularly preferably 5,000 to 1,000,000

The weight average molecular weight in the present invention is a value measured by gel permeation chromatography (GPC) and reduced to standard polystyrene.

An acid value of the carboxyl group-containing alkali-soluble polymer of the component (A) can be prescribed so that it can be developed by the alkaline developer described above in a step for forming a core pattern by development. When using, for example, the alkaline developer described above, the acid value is preferably 20 to 300 mg KOH/g.

If the acid value is 20 mg KOH/g or more, the development is easy, and if it is 300 mg KOH/g or less, the developer resistance is not reduced. From the viewpoints described above, the acid value is more preferably 30 to 250 mg KOH/g, particularly preferably 40 to 200 mg KOH/g.

Incidentally, the developer resistance means the property that a part which remains as a pattern without being removed by development is not affected by a developer.

When using an alkaline quasi-aqueous developer comprising an alkaline aqueous solution and at least one organic solvent, the acid value is preferably 10 to 260 mg KOH/g. If the acid value is 10 mg KOH/g or more, the development is easy, and if it is 260 mg KOH/g or less, the developer resistance (property that a part which remains as a pattern without being removed by development is not affected by a developer) is not reduced. From the viewpoints described above, the acid value is more preferably 20 to 250 mg KOH/g, particularly preferably 30 to 200 mg KOH/g.

A blend amount of the component (A) is preferably 10 to 85% by mass based on the whole amount of the component (A) and the component (B). If it is 10% by mass or more, a cured matter of the photosensitive resin composition for forming an optical waveguide is satisfactory in a strength and a flexibility. If it is 85% by mass or less, the component (A) is entwined in the component (B) and readily cured in exposing, and it is not short of a developer resistance. From the viewpoints described above, a blend amount of the component (A) is more preferably 20 to 80% by mass, particularly preferably 25 to 75% by mass.

The polymerizable compound (B) used in the present invention shall be explained below.

The polymerizable compound of the component (B) shall not specifically be restricted and includes suitably, for example, compounds having a polymerizable substituent such as an ethylenically unsaturated group and the like, compounds having two or more epoxy groups in a molecule and the like.

To be specific, it includes (meth)acrylates, vinylidene halides, vinyl ethers, vinyl esters, vinylpyridine, vinylamide, arylated vinyl and the like, and among them, (meth)acrylates and arylated vinyl are preferred from the viewpoint of the transparency. Any of the monofunctional compounds, difunctional compounds and the multifunctional compounds can be used as the (meth)acrylate.

The monofunctional (meth)acrylate shall not specifically be restricted and includes, for example, aliphatic (meth)acrylates such as methyl(meth)acrylate, ethyl(meth)acrylate, propyl(meth)acrylate, isopropyl(meth)acrylate, butyl(meth) acrylate, isobutyl(meth)acrylate, sec-butyl(meth)acrylate, tert-butyl(meth)acrylate, butoxyethyl(meth)acrylate, pentyl (meth)acrylate, hexyl(meth)acrylate, 2-ethylhexyl(meth) acrylate, heptyl(meth)acrylate, octylheptyl(meth)acrylate, nonyl(meth)acrylate, decyl(meth)acrylate, undecyl(meth) acrylate, lauryl(meth)acrylate, tridecyl(meth)acrylate, tetradecyl(meth)acrylate, pentadecyl(meth)acrylate, hexadecyl (meth)acrylate, stearyl(meth)acrylate, vehenyl(meth) acrylate, 2-hydroxyethyl(meth)acrylate, 2-hydroxypropyl (meth)acrylate, 3-chloro-2-hydroxypropyl(meth)acrylate, 2-hydroxybutyl(meth)acrylate and the like; alicyclic (meth) acrylates such as cyclopentyl(meth)acrylate, cyclohexyl (meth)acrylate, dicyclopentanyl(meth)acrylate, dicyclopentenyl(meth)acrylate, isobornyl(meth)acrylate and the like; aromatic (meth)acrylates such as phenyl(meth)acrylate, nonylphenyl(meth)acrylate, p-cumylphenyl(meth)acrylate, o-biphenyl(meth)acrylate, 1-naphthyl(meth)acrylate, 2-naphthyl (meth)acrylate, benzyl(meth)acrylate, 2-hydroxy-3-phenoxypropyl(meth)acrylate, 2-hydroxy-3-(o-phenylphenoxy)propyl(meth)acrylate, 2-hydroxy-3-(1-naphthoxy)propyl(meth)acrylate, 2-hydroxy-3-(2-naphthoxy)propyl(meth)acrylate and the like; heterocyclic (meth)acrylates such as 2-tetrahydrofurfuryl(meth)acrylate, N-(meth)acryloyloxyethylhexahydrophthalimide, 2-(meth) acryloyloxyethyl-N-carbazole and the like; ethoxylated compounds thereof; propoxylated compounds thereof; ethoxylated propoxylated compounds thereof; caprolactone-modified compounds thereof and the like.

Among them, preferred from the viewpoints of the transparency and the heat resistance are the alicyclic (meth)acrylates; the heterocyclic (meth)acrylates each described above; the ethoxylated compounds thereof; the propoxylated compounds thereof; the ethoxylated propoxylated compounds thereof; and the caprolactone-modified compounds thereof.

The difunctional (meth)acrylate shall not specifically be restricted and includes, for example, aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth) acrylate, tetrapropylene glycol di(meth)acrylate, polypropylene glycol di(meth)acrylate, 1,3-butanediol di(meth) acrylate, 2-methyl-1,3-propanediol di(meth)acrylate, 1,4-butanediol di(meth)acrylate, neopentyl glycol di(meth) acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth) acrylate, 1,10-decanediol di(meth)acrylate, glycerin di(meth)acrylate, tricyclodecanedimethanol di(meth)acrylate and the like; alicyclic (meth)acrylates such as cyclohexanedimethanol(meth)acrylate, ethoxylated cyclohexanedimethanol(meth)acrylate, tricyclodecanedimethanol (meth)acrylate, hydrogenated bisphenol A di(meth)acrylate, hydrogenated bisphenol F di(meth)acrylate and the like; aromatic (meth)acrylates such as bisphenol A di(meth)acrylate, bisphenol F di(meth)acrylate, bisphenol AF di(meth)acrylate, fluorene type di(meth)acrylate and the like; heterocyclic (meth)acrylates such as isocyanuric acid di(meth)acrylate and the like; ethoxylated compounds thereof; propoxylated compounds thereof; ethoxylated propoxylated compounds thereof; caprolactone-modified compounds thereof; aliphatic epoxy(meth)acrylates such as neopentyl glycol type epoxy (meth)acrylate and the like; alicyclic epoxy(meth)acrylates such as cyclohexanedimethanol type epoxy(meth)acrylate, hydrogenated bisphenol A type epoxy(meth)acrylate, hydrogenated bisphenol F type epoxy(meth)acrylate and the like; and aromatic epoxy(meth)acrylates such as resorcinol type epoxy(meth)acrylate, bisphenol A type epoxy(meth)acrylate, bisphenol F type epoxy(meth)acrylate, bisphenol AF type epoxy(meth)acrylate, fluorene type epoxy(meth)acrylate and the like.

Among them, preferred from the viewpoints of the transparency and the heat resistance are the alicyclic (meth)acrylates; the aromatic (meth)acrylates; the heterocyclic (meth) acrylates each described above; the ethoxylated compounds thereof; the propoxylated compounds thereof; the ethoxylated propoxylated compounds thereof; the caprolactone-modified compounds thereof; the alicyclic epoxy(meth)acrylates; and the aromatic epoxy(meth)acrylates each described above.

The trifunctional or higher multifunctional (meth)acrylate shall not specifically be restricted and includes, for example, aliphatic (meth)acrylates such as trimethylolpropane tri (meth)acrylate, pentaerythritol tri(meth)acrylate, ditrimethylolpropane tetra(meth)acrylate, pentaerythritol tetra(meth) acrylate, dipentaerythritol penta(meth)acrylate, dipentaerythritol hexa(meth)acrylate and the like; heterocyclic (meth)acrylates such as isocyanuric acid tri(meth)acrylate and the like; ethoxylated compounds thereof; propoxylated compounds thereof; ethoxylated propoxylated compounds thereof; caprolactone-modified compounds thereof; and aromatic epoxy(meth)acrylates such as phenol novolak type epoxy(meth)acrylate, cresol novolak type epoxy(meth)acrylate and the like.

Among them, preferred from the viewpoints of the transparency and the heat resistance are the heterocyclic (meth) acrylates; the ethoxylated compounds thereof; the propoxylated compounds thereof; the ethoxylated propoxylated compounds thereof; the caprolactone-modified compounds thereof; and the aromatic epoxy(meth)acrylates.

The monofunctional (meth)acrylates, the difunctional (meth)acrylates and the trifunctional or higher multifunctional (meth)acrylates each described above can be used alone or in combination of two or more kinds thereof. Also, they can be used as well in combination with (meth)acrylates having a different number of functional groups. Further, they can be used as well in combination with other polymerizable compounds.

The preferred polymerizable compound (B) includes as well compounds having two or more epoxy groups in a molecule in addition to the (meth)acrylates from the viewpoint of a compatibility thereof with the carboxyl group-containing alkali-soluble polymer (A).

To be specific, they include difunctional phenol glycidyl ether type epoxy resins such as hydroquinone type epoxy resins, resorcinol type epoxy resins, catechol type epoxy resins, bisphenol A type epoxy resins, tetrabromobisphenol A type epoxy resins, bisphenol F type epoxy resins, bisphenol AF type epoxy resins, bisphenol AD type epoxy resins, biphenyl type epoxy resins, naphthalene type epoxy resins, fluorene type epoxy resins and the like; hydrogenated difunctional phenol glycidyl ether type epoxy resins such as hydrogenated bisphenol A type epoxy resins, hydrogenated bisphenol F type epoxy resins, hydrogenated 2,2'-biphenol type epoxy resins, hydrogenated 4,4'-biphenol type epoxy resins and the like; trifunctional or higher multifunctional phenol glycidyl ether type epoxy resins such as phenol novolak type epoxy resins, cresol novolak type epoxy resins, dicyclopentadiene-phenol type epoxy resins, dicyclopentadiene-cresol type epoxy resins, tetraphenylolethane type epoxy resins and the like; difunctional aliphatic alcohol glycidyl ether type epoxy resins such as polyethylene glycol type epoxy resins, polypropylene glycol type epoxy resins, neopentyl glycol type epoxy resins, 1,6-hexanediol type epoxy resins and the like; difunctional alicyclic alcohol glycidyl ether type epoxy resins such as cyclohexanediol type epoxy resins, cyclohexanedimethanol type epoxy resins, tricyclodecanedimethanol type epoxy resins and the like; trifunctional or higher multifunctional aliphatic alcohol glycidyl ether type epoxy resins such as trimethylolpropane type epoxy resins, sorbitol type epoxy resins, glycerin type epoxy resins and the like; difunctional aromatic glycidyl esters such as diglycidyl phthalate and the like; difunctional alicyclic glycidyl esters such as diglycidyl tetrahydrophthalate, diglycidyl hexahydrophthalate and the like; difunctional aromatic glycidylamines such as N,N-diglycidylaniline, N,N-diglycidyltrifluoromethylaniline and the like; trifunctional or higher multifunctional aromatic glycidylamines such as N,N,N',N'-tetraglycidyl-4,4-diaminodiphenylmethane, 1,3-bis(N,N-glycidylaminomethyl)cyclohexane, N,N,o-triglycidyl-p-aminophenol and the like; difunctional alicyclic epoxy resins such as alicyclic diepoxy acetal, alicyclic diepoxy adipate, alicyclic diepoxy carboxylate, vinyl cyclohexene dioxide and the like; trifunctional or higher multifunctional alicyclic epoxy resins such as 1,2-epoxy-4-(2-oxiranyl)cyclohexane adducts of 2,2-bis(hydroxymethyl)-1-butanol and the like; trifunctional or higher multifunctional heterocyclic epoxy resins such as triglycidyl isocyanurate and the like; and difunctional or trifunctional or higher multifunctional silicon-containing epoxy resins such as organopolysiloxane type epoxy resins and the like.

Among them, preferred from the viewpoints of the transparency and the heat resistance are the difunctional phenol glycidyl ether type epoxy resins; the hydrogenated difunctional phenol glycidyl ether type epoxy resins; the trifunctional or higher multifunctional phenol glycidyl ether type epoxy resins; the difunctional alicyclic alcohol glycidyl ether phenol glycidyl ether type epoxy resins; the difunctional aromatic glycidyl ester phenol glycidyl ether type epoxy resins; the difunctional alicyclic glycidyl ester phenol glycidyl ether type epoxy resins; the difunctional alicyclic epoxy resins; the multifunctional alicyclic epoxy resins; the multifunctional heterocyclic epoxy resins; and the difunctional or multifunctional silicon-containing epoxy resins each described above.

The above compounds can be used alone or in combination of two or more kinds thereof, and they can be used as well in combination with other polymerizable compounds.

A blend amount of the polymerizable compound of the component (B) is preferably 15 to 90% by mass based on the total amount of the component (A) and the component (B). If it is 15 mass % or more, the component (B) entwines therein the carboxyl group-containing alkali-soluble polymer of the component (A) and is readily cured, and the developer resistance is not short. If it is 90% by mass or less, the cured film is satisfactory in a film strength and a flexibility. From the viewpoints described above, the blend amount of the component (B) is more preferably 20 to 80 mass % particularly preferably 25 to 75 mass %.

The component (C) used in the present invention shall be explained below.

The photopolymerization initiator of the component (C) shall not specifically be restricted as long as it initiates polymerization by irradiation with an actinic ray such as a UV ray and the like, and when a compound having an ethylenically unsaturated group is used as the polymerizable compound of the component (B), the photopolymerization initiator (C) includes photoradical polymerization initiators and the like.

The photoradical polymerization initiators shall not specifically be restricted and include, for example, benzoin ketals such as 2,2-dimethoxy-1,2-diphenylethane-1-one and the like; α-hyroxyketones such as 1-hydroxycyclohexyl phenyl ketone, 2-hydroxy-2-methyl-1-phenylpropane-1-one, 1-[4-(2-hydroxyethoxy)phenyl]-2-hydroxy-2-methyl-1-propane-1-one, 2-hydroxy-1-{4-[4-(2-hydroxy-2-methylpropionyl)benzyl]phenyl}-2-methylpropane-1-one and the like; glyoxy esters such as methylphenylglyoxylate, ethylphenylglyoxylate, 2-(2-hydroxyethoxy)ethyl oxyphenylacetate, 2-(2-oxo-2-phenylacetoxyethoxy)ethyl oxyphenylacetate and the like; α-amionoketones such as 2-benzyl-2-dimethylamino-1-(4-morpholine-4-ylphenyl)-butane-1-one, 2-dimethylamino-2-(4-methylbenzyl)-1-(4-morpholine-4-ylphenyl)-butane-1-one, 1,2-methyl-1-[4-(methylthio)phenyl]-4-(morpholine)-2-ylpropane-1-one and the like; oxime esters such as 1,2-octanedione, 1-[(4-phenylthio)-,2-(O-benzoyloxime)], ethanone, 1-[9-ethyl-6-(2-methylbenzoyl)-9H-carbazole-3-yl], 1-(O-acetyloxime) and the like; phosphine oxides such as bis(2,4,6-trimethylbenzoyl)phenylphosphine oxide, bis(2,6-dimethoxybenzoyl)-2,4,4-trimethylpentylphosphine oxide, 2,4,6-trimethylbenzoyldiphenylphosphine oxide and the like; 2,4,5-triarylimidazole dimers such as 2-(o-ohlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer and the like; benzophenone compounds such as benzophenone, N,N'-tetramethyl-4,4'-diaminobenzophenone, N,N'-tetraethyl-4,4'-diaminobenzophenone, 4-methoxy-4'-dimethylaminobenzophenone and the like; quinone compounds such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, 2,3-dimethylanthraquinone and the like; benzoin ethers such as benzoin methyl ether, benzoin ethyl ether, benzoin phenyl ether and the like; benzoin compounds such as benzoin, methylbenzoin, ethylbenzoin and the like; benzyl compounds such as benzyl dimethyl ketal and the like; acridine compounds such as 9-phenylacridine, 1,7-bis(9,9'-acridinylheptane) and the like; N-phenylglycine, coumarin and the like.

Further, in the 2,4,5-triarylimidazole dimers described above, two triarylimidazole sites may have the same substituents on the aryl groups to provide the symmetric compounds or may have different substituents on the aryl groups to provide the asymmetric compounds.

Among them, the α-hyroxyketones, the glyoxy esters, oxime esters and the phosphine oxides each described above are preferred from the viewpoints of a curing property, a transparency and a heat resistance.

The above photoradical polymerization initiators can be used alone or in combination of two or more kinds thereof. Further, they can be used as well in combination with suited sensitizers.

When an epoxy resin is used as the polymerizable compound of the component (B), the photopolymerization initiator of the component (C) includes photocationic polymerization initiators and the like.

The photocationic polymerization initiators include, for example, aryldiazonium salts such as p-methoxybenzenediazonium hexafluorophosphate and the like; diaryliodonium salts such as diphenyliodonium hexafluorophosphate, diphenyliodonium hexafluoroantimonate and the like; triarylsulfonium salts such as triphenylsulfonium hexafluorophosphate, triphenylsulfonium hexafluoroantimonate, diphenyl-4-thiophenoxyphenylsulfonium hexafluorophosphate, diphenyl-4-thiophenoxyphenylsulfonium hexafluoroantimonate, diphenyl-4-thiophenoxyphenylsulfonium pentafluorohydroxyantimonate and the like; triarylselenonium salts such as triphenylselenonium hexafluorophosphate, triphenylselenonium tetrafluoroborate, triphenylselenonium hexafluoroantimonate and the like; dialkylphenacylsulfonium salts such as dimethylphenacylsulfonium hexafluoroantimonate, diethylphenacylsulfonium hexafluoroantimonate and the like; dialkyl-4-hydroxy salts such as 4-hydroxyphenyldimethylsulfonium hexafluoroantimonate, 4-hydroxyphenylbenzylmethylsulfonium hexafluoroantimonate and the like; and sulfonic acid esters such as α-hydroxymethylbenzoinsulfonates, N-hydroxyimidosulfonates, α-sulfonyloxyketone, 3-sulfonyloxyketone and the like.

Among them, the triarylsulfonium salts described above are preferred from the viewpoints of a curing property, a transparency and a heat resistance. The above heat and photocationic polymerization initiators can be used alone or in combination of two or more kinds thereof. Further, they can be used in combination with suited sensitizers.

A blend amount of the polymerization initiator of the component (C) is preferably 0.1 to 10 parts by mass based on the total amount 100 parts by mass of the component (A) and the component (B). If it is 0.1 part by mass or more, curing is satisfactory, and if it is 10 parts by mass or less, the sufficiently high light transmittance is obtained. From the viewpoints described above, a blend amount of the component (C) is more preferably 0.3 to 7 parts by mass, particularly preferably 0.5 to 5 parts by mass.

Further, in addition thereto, so-called additives such as antioxidants, yellowing preventives, UV absorbers, visible light absorbers, coloring agents, plasticizers, stabilizers, fillers and the like may be added, if necessary, to the photosensitive resin composition for forming an optical waveguide used in the present invention.

The photosensitive resin composition for forming an optical waveguide used in the present invention shall be explained below.

The photosensitive resin composition for forming an optical waveguide used in the present invention may be diluted with a suited organic solvent and used in the form of a photosensitive resin varnish for forming an optical waveguide. The organic solvent used above shall not specifically be restricted as long as it can dissolve the above resin composition and includes, for example, aromatic hydrocarbons such as toluene, xylene, mesitylene, cumene, p-cymene and the like; cyclic ethers such as tetrahydrofuran, 1,4-dioxane and the like; alcohols such as methanol, ethanol, isopropanol, butanol, ethylene glycol, propylene glycol and the like; ketones such as acetone, methyl ethyl ketone, methyl isobutyl ketone, cyclohexanone, 4-hydroxy-4-methyl-2-pentanone and the like; esters such as methyl acetate, ethyl acetate, butyl acetate, methyl lactate, ethyl lactate, γ-butyrolactone and the like; carbonic esters such as ethylene carbonate, propylene carbonate and the like; polyhydric alcohol alkyl ethers such as ethylene glycol monomethyl ether, ethylene glycol monoethyl ether, ethylene glycol monobutyl ether, ethylene glycol dimethyl ether, ethylene glycol diethyl ether, propylene glycol monomethyl ether, propylene glycol monoethyl ether, propylene glycol dimethyl ether, propylene glycol diethyl ether, diethylene glycol monomethyl ether, diethylene glycol monoethyl ether, diethylene glycol monobutyl ether, diethylene glycol dimethyl ether, diethylene glycol diethyl ether and the like; polyhydric alcohol alkyl ether acetates such as ethylene glycol monomethyl ether acetate, ethylene glycol monoethyl ether acetate, ethylene glycol monobutyl ether acetate, propylene glycol monomethyl ether acetate, propylene glycol monoethyl ether acetate, diethylene glycol monomethyl ether acetate, diethylene glycol monoethyl ether acetate and the like; and amides such as N,N-dimethylformamide, N,N-dimethylacetamide, N-methylpyrrolidone and the like. The above organic solvents can be used alone or in combination of two or more kinds thereof.

Usually, a concentration of solid matters in the resin vanish is preferably 20 to 80% by mass.

In preparing the photosensitive resin varnish for forming an optical waveguide, it is mixed preferably by stirring. The stirring method shall not specifically be restricted, and stirring carried out by using a propeller is preferred from the viewpoint of a stirring efficiency. A revolution of the propeller in stirring shall not specifically be restricted, and it is preferably 10 to 1,000 min$^{-1}$. If it is 10 min$^{-1}$ or more, the respective components of the components (A) to (C) and the organic solvent are sufficiently mixed, and if it is 1,000 min$^{-1}$ or less, air bubbles produced by rotation of the propeller are less mixed in. From the viewpoints described above, the revolution is more preferably 50 to 800 min$^{-1}$, particularly preferably 100 to 500 min$^{-1}$.

The stirring time shall not specifically be restricted, and it is preferably 1 to 24 hours. If it is 1 hour or longer, the respective components of the components (A) to (C) and the organic solvent are sufficiently mixed, and if it is 24 hours or shorter, time for preparing the varnish can be shortened to make it possible to enhance the productivity.

The photosensitive resin varnish for forming an optical waveguide prepared is preferably filtrated through a filter having a pore diameter of 50 μm or less. If the pore diameter is 50 μm or less, large foreign matters are removed, and cissing is not caused in coating the varnish. Further, light transmitted through the core part is inhibited from being scattered. From the viewpoints described above, the resin varnish is filtrated through the filter having a pore diameter of more preferably 30 μm or less, particularly preferably 10 μm or less.

The photosensitive resin varnish for forming an optical waveguide prepared is preferably defoamed under reduced pressure. The defoaming method shall not specifically be restricted and includes, for example, a method in which a vacuum pump and a bell jar and a deforming apparatus equipped with a vacuum device are used. The pressure in the pressure reduction shall not specifically be restricted, and pressure at which the organic solvent contained in the resin varnish is not boiled is preferred.

The time for defoaming under reduced pressure shall not specifically be restricted, and it is preferably 3 to 60 minutes. If it is 3 minutes or longer, air bubbles dissolved in the resin varnish can be removed, and if it is 60 minutes or shorter, the solvent contained in the resin varnish is prevented from being volatized.

The photosensitive resin film for forming an optical waveguide used in the present invention shall be explained below.

The photosensitive resin film for forming an optical waveguide used in the present invention comprises the photosensitive resin composition for an optical waveguide described above, and it can readily be produced by applying the photosensitive resin varnish for forming an optical waveguide containing the components (A) to (C) each described above on a suited support film and removing the solvent. Also, it may be produced by applying the photosensitive resin composition for forming an optical waveguide directly on a support film.

The support film shall not specifically be restricted and includes, for example, polyesters such as polyethylene terephthalate, polybutylene terephthalate, polyethylene naphthalate and the like; polyolefins such as polyethylene, polypropylene and the like; polycarbonate, polyamide, polyimide, polyamideimide, polyetherimide, polyether sulfide, polyethersulfone, polyether ketone, polyphenylene ether, polyphenylene sulfide, polyallylate, polysulfone, liquid crystal polymers and the like.

Among them, preferred from the viewpoints of a flexibility and a toughness are polyethylene terephthalate, polybutylene terephthalate, polyethylene naphthalate, polypropylene, polycarbonate, polyamide, polyimide, polyamideimide, polyphenylene ether, polyphenylene sulfide, polyallylate and polysulfone.

Further, a substrate film of a high transparent type is more preferably used from the viewpoints of enhancing a transmission factor of an actinic ray for exposure and reducing roughening of side walls of the core patterns. The above substrate film of a high transparent type includes Cosmo Shine A1517 and Cosmo Shine A4100 each manufactured by Toyobo Co., Ltd.

From the viewpoint of enhancing a peeling property from the resin layer, the film subjected to mold release treatment by a silicone base compound, a fluorine-containing compound and the like may be used if necessary.

A thickness of the support film may suitably be changed according to the targeted flexibility, and it is preferably 3 to 250 μm. If it is 3 μm or more, a strength of the film is sufficiently high, and if it is 250 μm or less, the sufficiently large flexibility is obtained. From the viewpoints described above, a thickness of the support film is more preferably 5 to 200 μm, particularly preferably 7 to 150 μm.

Among them, a thickness of the support film used for the photosensitive resin film for forming a core part is preferably 5 to 50 μm. If it is 5 μm or more, a strength thereof as a support is sufficiently high, and if it is 50 μm or less, a gap between a photomask and a layer of the photosensitive resin composition for forming a core part is not increased in forming a core pattern, so that the pattern-forming property is good. From the viewpoints described above, a thickness of the support film used for the photosensitive resin film for forming a core part is more preferably 10 to 40 μm, particularly preferably 15 to 30 μm.

The photosensitive resin film produced by coating the photosensitive resin vanish for forming an optical waveguide or the photosensitive resin composition for forming an optical waveguide on the support film may assume a three layer structure in which the protective film is stuck, if necessary, on the resin layer and which comprises the support film, the resin layer and the protective film.

The protective film shall not specifically be restricted, and from the viewpoints of a flexibility and a toughness, it suitably includes, for example, polyesters such as polyethylene terephthalate, polybutylene terephthalate, polyethylene naphthalate and the like; and polyolefins such as polyethylene, polypropylene and the like.

From the viewpoint of enhancing a peeling property from the resin layer, the film subjected to mold release treatment by a silicone base compound, a fluorine-containing compound and the like may be used if necessary. A thickness of the protective film may be changed according to the targeted flexibility, and it is preferably 10 to 250 μm. If it is 10 μm or more, a strength of the film is sufficiently high, and if it is 250 μm or less, the sufficiently large flexibility is obtained. From the viewpoints described above, a thickness of the protective film is more preferably 15 to 200 μm, particularly preferably 20 to 150 μm.

A thickness of the resin layer in the photosensitive resin film for forming an optical waveguide used in the present invention shall not specifically be restricted, and usually it is preferably 5 to 500 μm in terms of a thickness after drying. If it is 5 μm or more, the thickness is sufficiently large, and therefore a strength of the resin film or a cured matter of the resin film is sufficiently high. On the other hand, if it is 500 μm or less, the resin film can sufficiently be dried. Accordingly, an amount of the solvent remaining in the resin film is not increased, and the cured matter of the resin film is not foamed when heated.

The photosensitive resin film for forming an optical waveguide thus obtained can readily be stored by, for example, reeling in a roll form. Alternatively, the roll-shaped film can be stored as well in a sheet form by cutting the film in a suited size.

An optical waveguide formed by the production process of the present invention shall be explained below.

In the optical waveguide formed by the production process of the present invention, an optical propagation loss is preferably 0.3 dB/cm or less. If it is 0.3 dB/cm or less, a loss of light is reduced, and an intensity of transmission signals is sufficiently large. From the viewpoints described above, the optical propagation loss is more preferably 0.2 dB/cm or less.

In the optical waveguide formed by the production process of the present invention, an optical propagation loss after carrying out a high temperature & high humidity leaving test at a temperature of 85° C. and a humidity of 85% for 1000 hours is preferably 0.3 dB/cm or less. If it is 0.3 dB/cm or less, a loss of light is reduced, and an intensity of transmission signals is sufficiently large. The high temperature & high humidity leaving test at a temperature of 85° C. and a humidity of 85% means a high temperature & high humidity leaving test carried out on conditions according to a JPCA standard (JPCA-PE02-05-01S).

In the optical waveguide formed by the production process of the present invention, an optical propagation loss after carrying out a temperature cycle test at a temperature between −55° C. and 125° C. for 1000 cycles is preferably 0.3 dB/cm or less. If it is 0.3 dB/cm or less, a loss of light is reduced, and an intensity of transmission signals is sufficiently large. The temperature cycle test at a temperature between −55° C. and 125° C. means a temperature cycle test carried out on conditions according to the JPCA standard (JPCA-PE02-05-01S).

In the optical waveguide formed by the production process of the present invention, an optical propagation loss after carrying out three times a reflow test at a maximum temperature of 265° C. is preferably 0.3 dB/cm or less. If it is 0.3 dB/cm or less, a loss of light is reduced, and an intensity of transmission signals is sufficiently large. In addition thereto, parts can be mounted in a reflow process, and therefore an application range thereof is broadened. The reflow test at a maximum temperature of 265° C. means a lead-free solder reflow test carried out on conditions according to a JEDEC standard (JEDEC JESD22A113E).

The optical waveguide formed by the production process of the present invention is excellent in a heat resistance and a transparency and therefore may be used as an optical transmission line for an optical module. The form of the optical module includes, for example, an optical waveguide provided with optical fibers in which the optical fibers are connected at both ends of the optical waveguide, an optical waveguide provided with connecters in which the connecters are connected at both ends of the optical waveguide, a photoelectric combined substrate in which an optical waveguide is combined with a printed wiring board, a photoelectric conversion module in which an optical waveguide is combined with a light/electricity conversion element for mutually converting a light signal and an electric signal and a wavelength coupling & branching device in which an optical waveguide is combined with a wavelength split filter.

In the photoelectric combined substrate, the combined printed wiring board shall not specifically be restricted, and either of a rigid substrate such as a glass epoxy substrate and the like and a flexible substrate such as a polyimide substrate and the like may be used.

EXAMPLES

The examples of the present invention shall more specifically be explained below with reference to examples, but the present invention shall by no means be restricted to these examples.

Production Example 1

Preparation of Carboxyl Group-Containing Alkali-Soluble (meth)acryl Polymer P-1

Propylene glycol monomethyl ether acetate 97 parts by mass and methyl lactate 24 parts by mass were weighed into a flask equipped with a stirrer, a cooling tube, a gas-introducing tube, a dropping funnel and a thermometer, and the mixture was stirred while introducing a nitrogen gas.

The liquid temperature was elevated to 80° C., and a mixture of N-cyclohexylmaleimide 18 parts by mass, dicyclopentanyl methacrylate 43 parts by mass, 2-hydroxyethyl methacrylate 53 parts by mass, methacrylic acid 20 parts by mass, 2,2'-azobis(isobutyronitrile) 1 part by mass, propylene glycol monomethyl ether acetate 65 parts by mass and methyl lactate 16 parts by mass was dropwise added thereto in 3 hours. Then, the mixture was stirred at 80° C. for 3 hours and continued to be further stirred at 120° C. for 1 hour, and then it was cooled down to room temperature.

Subsequently, dibutyltin dilaurate 0.07 part by mass and p-methoxyphenol 0.2 part by mass were added thereto and stirred while introducing air. The liquid temperature was elevated to 60° C., and a mixture of 2-methacryloyloxyethyl isocyanate 31 parts by mass and propylene glycol monomethyl ether acetate 47 parts by mass was dropwise added in 30 minutes, and then the mixture was continued to be stirred at 60° C. for 4 hours to obtain a (meth)acryl polymer P-1 solution (solid content: 40% by mass).

Measurement of Acid Value:

An acid value of (P-1) was measured to result in finding that it was 60 mg KOH/g. The acid value was calculated from an amount of a 0.1 mol/L potassium hydroxide aqueous solution required for neutralizing the solution (P-1). In this case, a point in which phenolphthalein added as an indicator was changed in a color from a solid color to a pink color was set to a neutralization point.

Measurement of Weight Average Molecular Weight:

A weight average molecular weight (reduced to standard polystyrene) of (P-1) was measured by means of GPC (trade name: SD-8022/DP-8020/RI-8020, manufactured by Tosoh Corp.) to result in finding that it was 31,000. Gelpack GL-A150-S/GL-A160-S (trade name) manufactured by Hitachi Chemical Co., Ltd. was used for the column.

Production Example 2

Preparation of Carboxyl Group-Containing Alkali-Soluble (meth)acryl Polymer P-2

Propylene glycol monomethyl ether acetate 97 parts by mass and methyl lactate 24 parts by mass were weighed into a flask equipped with a stirrer, a cooling tube, a gas-introducing tube, a dropping funnel and a thermometer, and the mixture was stirred while introducing a nitrogen gas.

The liquid temperature was elevated to 80° C., and a mixture of N-cyclohexylmaleimide 18 parts by mass, benzyl methacrylate 43 parts by mass, 2-hydroxyethyl methacrylate 53 parts by mass, methacrylic acid 20 parts by mass, 2,2'-azobis(isobutyronitrile) 1 part by mass, propylene glycol monomethyl ether acetate 65 parts by mass and methyl lactate 16 parts by mass was dropwise added thereto in 3 hours. Then, the mixture was stirred at 80° C. for 3 hours and continued to be further stirred at 120° C. for 1 hour to obtain a (meth)acryl polymer P-2 solution (solid content: 40% by mass).

An acid value and a weight average molecular weight of P-2 were measured by the same methods as in Production Example 1 to result in finding that they were 96 mg KOH/g and 29,000 respectively.

Production Example 3

Preparation of Carboxyl Group-Containing Alkali-Soluble (meth)acryl Polymer P-3

The P-2 solution (solid content: 40% by mass) described above 150 parts by mass (solid matter: 60 parts by mass), dibutyltin dilaurate 0.04 part by mass, p-methoxyphenol 0.1 part by mass and propylene glycol monomethyl ether acetate 21 parts by mass were weighed into a flask equipped with a stirrer, a cooling tube, a gas-introducing tube, a dropping funnel and a thermometer, and the mixture was stirred while introducing air.

The liquid temperature was elevated to 60° C., and 2-methacryloyloxyethyl isocyanate 14 parts by mass was dropwise added thereto in 30 minutes. Then, the mixture was continued to be stirred at 60° C. for 4 hours to obtain a (meth)acryl polymer P-3 solution (solid content: 40% by mass).

An acid value and a weight average molecular weight of P-3 were measured by the same methods as in Production Example 1 to result in finding that they were 58 mg KOH/g and 30,000 respectively.

Production Example 4

Preparation of Carboxyl Group-Containing Alkali-Soluble (meth)acryl Polymer P-4

Propylene glycol monomethyl ether acetate 60 parts by mass and methyl lactate 60 parts by mass were weighed into a flask equipped with a stirrer, a cooling tube, a gas-introducing tube, a dropping funnel and a thermometer, and the mixture was stirred while introducing a nitrogen gas.

The liquid temperature was elevated to 80° C., and a mixture of N-cyclohexylmaleimide 18 parts by mass, benzyl methacrylate 61 parts by mass, 2-hydroxyethyl methacrylate 18 parts by mass, methacrylic acid 37 parts by mass, 2,2'-azobis(isobutyronitrile) 1 part by mass, propylene glycol monomethyl ether acetate 40 parts by mass and methyl lactate 40 parts by mass was dropwise added thereto in 3 hours. Then, the mixture was stirred at 80° C. for 3 hours and continued to be further stirred at 120° C. for 1 hour, and it was cooled down to room temperature.

Subsequently, glycidyl methacrylate 28 parts by mass, p-methoxyphenol 0.2 part by mass and propylene glycol monomethyl ether acetate 43 parts by mass were added thereto and stirred while introducing air. The liquid temperature was elevated to 80° C., and triphenylphosphine 0.7 part by mass was added thereto. Then, the mixture was stirred at 80° C. for 1 hour and continued to be further stirred at 100° C. for 24 hours to obtain a (meth)acryl polymer P-4 solution (solid content: 40% by mass).

An acid value and a weight average molecular weight of P-4 were measured by the same methods as in Production Example 1 to result in finding that they were 80 mg KOH/g and 31,000 respectively.

Production Example 5

Preparation of Carboxyl Group-Containing Alkali-Soluble (meth)acryl Polymer P-5

Propylene glycol monomethyl ether acetate 94 parts by mass and methyl lactate 40 parts by mass were weighed into a flask equipped with a stirrer, a cooling tube, a gas-introducing tube, a dropping funnel and a thermometer, and the mixture was stirred while introducing a nitrogen gas.

The liquid temperature was elevated to 80° C., and a mixture of N-cyclohexylmaleimide 20 parts by mass, 2-ethylhexyl methacrylate 76 parts by mass, 2-hydroxyethyl methacrylate 25 parts by mass, methacrylic acid 27 parts by mass, 2,2'-azobis(isobutyronitrile) 0.8 part by mass, propylene glycol monomethyl ether acetate 63 parts by mass and methyl lactate 27 parts by mass was dropwise added thereto in 3 hours. Then, the mixture was stirred at 80° C. for 3 hours and continued to be further stirred at 120° C. for 1 hour, and it was cooled down to room temperature.

Subsequently, glycidyl methacrylate 21 parts by mass, p-methoxyphenol 0.3 part by mass and propylene glycol monomethyl ether acetate 32 parts by mass were added thereto and stirred while introducing air. The liquid temperature was elevated to 80° C., and triphenylphosphine 0.7 part by mass was added thereto. Then, the mixture was stirred at 80° C. for 1 hour and continued to be further stirred at 100° C. for 24 hours to obtain a (meth)acryl polymer P-5 solution (solid content: 40% by mass).

An acid value and a weight average molecular weight of P-5 were measured by the same methods as in Production Example 1 to result in finding that they were 56 mg KOH/g and 47,000 respectively.

Example 1

Preparation of Photosensitive Resin Varnish COV-1 for Forming a Core Part

Weighed into a wide mouth plastic bottle were 150 parts by mass (solid matter: 60 parts by mass) of the P-1 solution (solid content: 40% by mass) described above as the carboxyl group-containing alkali-soluble (meth)acryl polymer (A), 20 parts by mass of ethoxylated bisphenol A diacrylate (trade name: A-BPE-10, manufactured by Shin-Nakamura Chemical Co., Ltd.) and 20 parts by mass of p-cumylphenoxyethyl acrylate (trade name: A-CMP-1E, manufactured by Shin-Nakamura Chemical Co., Ltd.) as the polymerizable compound (B) and 1 part by mass of 1-[4-(2-hydroxyethoxy)phenyl]-2-hydroxy-2-methyl-1-propane-1-one (trade name: Irgacure 2959, manufactured by Ciba Specialty Chemicals K.K.) and 1 part by mass of bis(2,4,6-trimethylbenzoyl)phenylphosphine oxide (trade name: Irgacure 819, manufactured by Ciba Specialty Chemicals K.K.) as the polymerization initiator (C), and the mixture was stirred for 6 hours on the conditions of a temperature of 25° C. and a revolution of 400 rpm by means of a stirrer to prepare a photosensitive resin varnish for forming a core part.

Then, the resin varnish was filtrated under pressure through a polyflon filter (trade name: PF020, manufactured by Advantec Toyo Kaisha, Ltd.) having a pore diameter of 2 μm and a membrane filter (trade name: J050A, manufactured by Advantec Toyo Kaisha, Ltd.) having a pore diameter of 0.5 μm on the conditions of a temperature of 25° C. and a pressure of 0.4 MPa. Subsequently, it was defoamed under reduced pressure for 15 minutes on the condition of a vacuum degree of 50 mm Hg by means of a vacuum pump and a bell jar to obtain a photosensitive resin varnish COV-1 for forming a core part.

Preparation of Photosensitive Resin Film COF-1 for Forming a Core Part:

The photosensitive resin varnish COV-1 for forming a core part described above was applied on a non-treated surface of a polyethylene terephthalate film (trade name: A1517, thickness: 16 μm, manufactured by Toyobo Co., Ltd.) by means of an applicator (Multicoater TM-MC, manufactured by Hirano Tecseed Co., Ltd.) and dried at 100° C. for 20 minutes. Then, a mold release polyethylene terephthalate film (trade name: A31, thickness: 25 μm, manufactured by Teijin DuPont Films Japan Ltd.) was stuck thereon as a protective film to obtain a photosensitive resin film COF-1 for forming a core part. In this case, a thickness of the resin layer could optionally be controlled by controlling a gap of the applicator, and it was controlled in the present example so that the film thickness after cured was 50 μm.

Preparation of Photosensitive Resin Varnish CLV-1 for Forming a Cladding Layer:

Weighed into a wide mouth plastic bottle were 150 parts by mass (solid matter: 60 parts by mass) of the P-1 solution (solid content: 40% by mass) described above as the carboxyl group-containing alkali-soluble (meth)acryl polymer (A), 20 parts by mass of ethoxylated isocyanuric acid triacrylate (trade name: A-9300, manufactured by Shin-Nakamura Chemical Co., Ltd.) and 20 parts by mass of ethoxylated cyclohexanedimethanol diacrylate (trade name: A-CHD-4E, manufactured by Shin-Nakamura Chemical Co., Ltd.) as the polymerizable compound (B) and 1 part by mass of 1-[4-(2-hydroxyethoxy)phenyl]-2-hydroxy-2-methyl-1-propane-1-one (trade name: Irgacure 2959, manufactured by Ciba Specialty Chemicals K.K.) and 1 part by mass of bis(2,4,6-trimethylbenzoyl)phenylphosphine oxide (trade name: Irgacure 819, manufactured by Ciba Specialty Chemicals K.K.) as the polymerization initiator (C), and the mixture was stirred for 6 hours on the conditions of a temperature of 25° C. and a revolution of 400 min$^{-1}$ by means of a stirrer to prepare a photosensitive resin varnish for forming a cladding layer.

Then, the resin varnish was filtrated under pressure through the polyflon filter (trade name: PF020, manufactured by Advantec Toyo Kaisha, Ltd.) having a pore diameter of 2 μm and the membrane filter (trade name: J050A, manufactured by Advantec Toyo Kaisha, Ltd.) having a pore diameter of 0.5 μm on the conditions of a temperature of 25° C. and a pressure of 0.4 MPa. Subsequently, it was defoamed under reduced pressure for 15 minutes on the condition of a vacuum degree of 50 mm Hg by means of a vacuum pump and a bell jar to obtain a photosensitive resin varnish CLV-1 for forming a cladding layer.

Preparation of Photosensitive Resin Film CLF-1 for Forming a Cladding Layer:

The photosensitive resin varnish CLV-1 for forming a cladding layer described above was applied on a non-treated surface of the polyethylene terephthalate film (trade name: A1517, thickness: 16 μm, manufactured by Toyobo Co., Ltd.) by means of the applicator (trade name: Multicoater TM-MC, manufactured by Hirano Tecseed Co., Ltd.) and dried at 100° C. for 20 minutes. Then, the mold release polyethylene terephthalate film (trade name: A31, thickness: 25 μm, manufactured by Teijin DuPont Films Japan Ltd.) was stuck thereon as a protective film to obtain a photosensitive resin film CLF-1 for forming a cladding layer.

In this case, a thickness of the resin layer after cured could optionally be controlled by controlling a gap of the applicator, and it was controlled in the present example so that the film thicknesses after cured were 30 μm for the photosensitive resin film for forming a lower cladding layer and 80 μm for the photosensitive resin film for forming an upper cladding layer.

Preparation of Optical Waveguide:

The photosensitive resin film CLF-1 for forming a lower cladding layer from which the protective film (A31) was peeled off was laminated on an FR-4 substrate (trade name: E-679F6, manufactured by Hitachi Chemical Co., Ltd.) on the conditions of a pressure of 0.4 MPa, a temperature of 80° C. and a speed of 0.4 m/minute by means of a roll laminator (trade name: HLM-1500, manufactured by Hitachi Chemical Techno Plant Co., Ltd.). Further, the resin film was pressed on the conditions of a pressure of 0.5 MPa, a temperature of 80° C. and a pressure time of 30 seconds by means of a vacuum press laminator (trade name: MVLP-500/600, manufactured by Meiki Co., Ltd.).

Next, the film was irradiated with a UV ray (wavelength: 365 nm) at an intensity of 2000 mJ/cm$^2$ by means of a UV ray exposing equipment (trade name: MAP-1200-L, manufactured by Dainippon Screen Mfg. Co., Ltd.), and then the support film (A1517) was removed to form a lower cladding layer.

Subsequently, the photosensitive resin film COF-1 for forming a core part from which the protective film (A31) was peeled off was laminated on the lower cladding layer on the conditions of a pressure of 0.4 MPa, a temperature of 80° C. and a speed of 0.4 m/minute by means of the roll laminator described above. Further, the resin film was pressed on the conditions of a pressure of 0.5 MPa, a temperature of 80° C. and a pressure time of 30 seconds by means of the vacuum press laminator described above.

Next, the film was irradiated with a UV ray (wavelength: 365 nm) at an intensity of 200 mJ/cm$^2$ via a negative type photomask having a width of 50 μm by means of the UV ray exposing equipment described above to expose the core part (core pattern). The film was subjected to after-exposure heating at 80° C. for 5 minutes, and then the support film (A1517) was removed to carry out development with a 1 mass % sodium carbonate aqueous solution. Subsequently, the film was washed with a 0.3 mass % sulfuric acid aqueous solution (pH=1) and then further washed with purified water, and it was dried by heating at 100° C. for 1 hour.

Next, the photosensitive resin film CLF-1 for forming an upper cladding layer from which the protective film (A31) was removed was laminated on the core pattern and the lower cladding layer on the conditions of a pressure of 0.5 MPa, a temperature of 80° C. and a pressing time of 30 seconds by means of the vacuum press laminator described above.

The resin film was irradiated with a UV ray (wavelength: 365 nm) at an intensity of 2000 mJ/cm$^2$, and the support film (A1517) was removed. Then, the film was subjected to heat treatment at 130° C. for 1 hour to thereby form an upper cladding layer, and an optical waveguide provided with a glass epoxy resin substrate was obtained. Thereafter, an optical waveguide having a waveguide length of 10 cm was cut out by means of a dicing saw (trade name: DAD-341, manufactured by DISCO Corporation).

Examples 2 to 8 and Comparative Examples 1 to 4

Photosensitive resin vanishes COV-2 to 4 for forming a core part were prepared according to blend ratios shown in Table 1. Further, photosensitive resin vanishes CLV-2 to 4 for forming a cladding layer were prepared according to blend ratios shown in Table 2. Photosensitive resin films COF-2 to 4 for forming a core part and photosensitive resin films CLF-2 to 4 for forming a cladding layer were prepared by the same methods as in Example 1.

The above photosensitive resin films for forming an optical waveguide were used to prepare optical waveguides by the same method as in Example 1, except that alkaline developers shown in Table 3 were used as the alkaline developer. Shown in Table 3 are the combinations of the photosensitive resin films for forming a core part and the photosensitive resin films for forming a cladding layer which were used for preparing the optical waveguides and the production processes for the optical waveguides.

In Comparative Examples 1 to 4, the optical waveguides were prepared without carrying out acid washing after development.

TABLE 1

| | Blend component | | COV-1 | COV-2 | COV-3 | COV-4 |
|---|---|---|---|---|---|---|
| (Meth)acryl polymer (A) (part by mass) | P-1 solution*[1] | (solid content: 40 mass %) | 150 (solid matter: 60) | — | — | — |
| | P-2 solution*[2] | (solid content: 40% by mass) | — | 150 (solid matter: 60) | — | — |
| | P-3 solution*[3] | (solid content: 40% by mass) | — | — | 150 (solid matter: 60) | — |
| | P-4 solution*[4] | (solid content: 40% by mass) | — | — | — | 150 (solid matter: 60) |
| Polymerizable compound (B) (part by mass) | A-BPE-10*[5] | | 20 | — | 20 | 20 |
| | EA-0500*[6] | | — | 20 | — | — |
| | A-CMP-1E*[7] | | 20 | 20 | — | — |
| | A-401P*[8] | | — | — | 20 | 20 |
| Polymerization initiator (C) (part by mass) | Irgacure 2959*[9] | | 1 | 1 | 1 | 1 |
| | Irgacure 819*[10] | | 1 | 1 | 1 | 1 |
| Photosensitive resin film for forming a core part | | | COF-1 | COF-2 | COF-3 | COF-4 |

*[1](meth)acryl polymer solution prepared in Production Example 1
*[2](meth)acryl polymer solution prepared in Production Example 2
*[3](meth)acryl polymer solution prepared in Production Example 3
*[4](meth)acryl polymer solution prepared in Production Example 4
*[5]ethoxylated bisphenol A diacrylate (manufactured by Shin-Nakamura Chemical Co., Ltd.)
*[6]ethoxylated fluorene type diacrylate (manufactured by Osaka Gas Chemicals Co., Ltd.)
*[7]p-cumylphenoxyethyl acrylate (manufactured by Shin-Nakamura Chemical Co., Ltd.)
*[8]2-hydroxy-3-(o-pheylphenoxy)propyl acrylate (manufactured by Shin-Nakamura Chemical Co., Ltd.)
*[9]1-[4-(2-hydroxyethoxy)phenyl]-2-hydroxy-2-methyl-1-propane-1-one (manufactured by Ciba Specialty Chemicals K.K.)
*[10]bis(2,4,6-trimethylbenzoyl)phenylphosphine oxide (manufactured by Ciba Specialty Chemicals K.K.)

TABLE 2

| | Blend component | | CLV-1 | CLV-2 | CLV-3 | CLV-4 |
|---|---|---|---|---|---|---|
| (Meth)acryl polymer (A) (part by mass) | P-1 solution*[1] | (solid content: 40% by mass) | 150 (solid matter: 60) | 150 (solid matter: 60) | — | — |
| | P-5 solution*[11] | (solid content: 40% by mass) | — | — | 150 (solid matter: 60) | 150 (solid matter: 60) |
| Polymerizable compound (B) (part by mass) | A-9300*[12] | | 20 | — | 20 | 20 |
| | EA-5420*[13] | | — | 20 | — | — |
| | A-CHD-4E*[14] | | 20 | 20 | 20 | — |
| | M-215*[15] | | — | — | — | 20 |

TABLE 2-continued

|  | Blend component | CLV-1 | CLV-2 | CLV-3 | CLV-4 |
|---|---|---|---|---|---|
| Polymerization initiator (C) (part by mass) | Irgacure 2959*9 | 1 | 1 | 1 | 1 |
|  | Irgacure 819*10 | 1 | 1 | 1 | 1 |
| Photosensitive resin film for forming a cladding layer |  | CLF-1 | CLF-2 | COF-3 | CLF-4 |

*1(meth)acryl polymer solution prepared in Production Example 1
*11(meth)acryl polymer solution prepared in Production Example 5
*12ethoxylated isocyanuric acid triacrylate (manufactured by Shin-Nakamura Chemical Co., Ltd.)
*13hydrogenated bisphenol A type epoxy acrylate (manufactured by Shin-Nakamura Chemical Co., Ltd.)
*14ethoxylated cyclohexanedimethanol diacrylate (manufactured by Shin-Nakamura Chemical Co., Ltd.)
*15ethoxylated isocyanuric acid diacrylate (manufactured by Toagosei Co., Ltd.)
*9 1-[4-(2-hydroxyethoxy)phenyl]-2-hydroxy-2-methyl-1-propane-1-one (manufactured by Ciba Specialty Chemicals K.K.)
*10bis(2,4,6-trimethylbenzoyl)phenylphosphine oxide (manufactured by Ciba Specialty Chemicals K.K.)

TABLE 3

|  | Photosensitive resin film for forming core part | Photosensitive resin film for forming cladding layer | Alkaline developer | Acid aqueous solution |
|---|---|---|---|---|
| Example 1 | COF-1 | CLF-1 | 1% sodium carbonate aqueous solution | 0.3 mass % sulfuric acid aqueous solution |
| Example 2 | COF-1 | CLF-2 | 1% sodium carbonate aqueous solution | 0.3 mass % sulfuric acid aqueous solution |
| Example 3 | COF-2 | CLF-1 | 1% sodium carbonate aqueous solution | 0.3 mass % sulfuric acid aqueous solution |
| Example 4 | COF-3 | CLF-1 | 1% tetramethylammonium hydroxide aqueous solution | 0.3 mass % sulfuric acid aqueous solution |
| Example 5 | COF-3 | CLF-3 | 1% tetramethylammonium hydroxide aqueous solution | 0.3 mass % sulfuric acid aqueous solution |
| Example 6 | COF-3 | CLF-4 | 1% tetramethylammonium hydroxide aqueous solution | 0.3 mass % sulfuric acid aqueous solution |
| Example 7 | COF-4 | CLF-3 | 1% tetramethylammonium hydroxide aqueous solution | 0.3 mass % sulfuric acid aqueous solution |
| Example 8 | COF-4 | CLF-4 | 1% tetramethylammonium hydroxide aqueous solution | 0.3 mass % sulfuric acid aqueous solution |
| Comparative Example 1 | COF-1 | CLF-1 | 1% sodium carbonate aqueous solution | — |
| Comparative Example 2 | COF-3 | CLF-3 | 1% tetramethylammonium hydroxide aqueous solution | — |
| Comparative Example 3 | COF-3 | CLF-4 | 1% tetramethylammonium hydroxide aqueous solution | — |
| Comparative Example 4 | COF-4 | CLF-4 | 1% tetramethylammonium hydroxide aqueous solution | — |

Example 9

The photosensitive resin film COF-1 for forming a core part and the photosensitive resin film CLV-1 for forming a cladding layer each described above were used to prepare an optical waveguide by the following method.

Preparation of Optical Waveguide:

The photosensitive resin film CLF-1 for forming a lower cladding layer from which the protective film (A31) was peeled off was laminated on the FR-4 substrate (trade name: E-679FB, manufactured by Hitachi Chemical Co., Ltd.) on the conditions of a pressure of 0.4 MPa, a temperature of 80° C. and a speed of 0.4 m/minute by means of the roll laminator (trade name: HLM-1500, manufactured by Hitachi Chemical Techno Plant Co., Ltd.). Further, the resin film was pressed on the conditions of a pressure of 0.5 MPa, a temperature of 80° C. and a pressure time of 30 seconds by means of the vacuum press laminator (trade name: MVLP-500/600, manufactured by Meiki Co., Ltd.).

Next, the film was irradiated with a UV ray (wavelength: 365 nm) at an intensity of 2000 mJ/cm² by means of the UV ray exposing equipment (trade name: MAP-1200-L, manufactured by Dainippon Screen Mfg. Co., Ltd.), and then the support film (A1517) was removed to form a lower cladding layer.

Subsequently, the photosensitive resin film COF-1 for forming a core part from which the protective film (A31) was peeled off was laminated on the lower cladding layer on the conditions of a pressure of 0.4 MPa, a temperature of 80° C. and a speed of 0.4 m/minute by means of the roll laminator described above. Further, the resin film was pressed on the conditions of a pressure of 0.5 MPa, a temperature of 80° C. and a pressure time of 30 seconds by means of the vacuum press laminator described above.

Next, the film was irradiated with a UV ray (wavelength: 365 nm) at an intensity of 200 mJ/cm² via a negative type photomask having a width of 50 µm by means of the UV ray exposing equipment described above to expose the core part (core pattern). The film was subjected to after-exposure heating at 80° C. for 5 minutes, and then the support film (A1517) was removed to carry out development with a 1 mass % sodium carbonate aqueous solution containing magnesium sulfate in an amount of 100 ppm by mass in terms of a magnesium ion. Subsequently, the film was washed with water containing magnesium sulfate in an amount of 100 ppm by mass in terms of a magnesium ion and then further washed with purified water, and it was dried by heating at 100° C. for 1 hour.

Next, the photosensitive resin film CLF-1 for forming an upper cladding layer from which the protective film (A31) was removed was laminated on the core pattern and the lower cladding layer on the conditions of a pressure of 0.5 MPa, a temperature of 80° C. and a pressing time of 30 seconds by means of the vacuum press laminator described above. The resin film was irradiated with a UV ray (wavelength: 365 nm) at an intensity of 2000 mJ/cm², and the support film (A1517) was removed. Then, the film was subjected to heat treatment at 130° C. for 1 hour to thereby form an upper cladding layer, and an optical waveguide provided with a glass epoxy resin substrate was obtained. Thereafter, an optical waveguide having a waveguide length of 10 cm was cut out by means of the dicing saw (trade name: DAD-341, manufactured by DISCO Corporation).

Examples 10 to 20 and Comparative Examples 5 to 8

The photosensitive resin films COF-1 and COF-4 for forming a core part and the photosensitive resin films CLV-1 and CLV-4 for forming a cladding layer each described above were used to prepare optical waveguides by the same method as in Example 9, except that alkaline developers and washing liquids shown in Table 4 were used as the alkaline developer and the washing liquid. Shown in Table 4 are the combinations of the photosensitive resin films for forming a core part and the photosensitive resin films for forming a cladding layer and the production processes for the optical waveguides.

Measurement of Optical Propagation Loss:

The optical propagation losses of the optical waveguides (waveguide length: 10 cm) obtained in Examples 1 to 20 and Comparative Examples 1 to 8 were measured using VCSEL (trade name: FLS-300-01-VCL, manufactured by EXFO Corporation) emitting light having a central wavelength of 850 nm which was used for a light source, a photosensitive sensor (trade name: Q82214, manufactured by Advantest Corporation), an incident fiber (GI-50/125 multimode fiber, NA=0.20) and an output fiber (SI-114/125, NA=0.22) by a cut-back method (measuring waveguide lengths: 10, 5, 3 and 2 cm), and they were evaluated by the following criteria:

○: 0.3 dB/cm less

X: larger than 0.3 dB/cm

TABLE 4

| | Photosensitive resin film for forming core part | Photosensitive resin film for forming cladding layer | Alkaline developer | Metal compound added to developer | | Metal compound added to washing liquid | |
|---|---|---|---|---|---|---|---|
| | | | | Kind | Metal ion amount (mass ppm) | Kind | Metal ion amount (mass ppm) |
| Example 9 | COF-1 | CLF-1 | 1% sodium carbonate aqueous solution | Magnesium sulfate | 100 | Magnesium sulfate | 100 |
| Example 10 | COF-1 | CLF-1 | 1% sodium carbonate aqueous solution | — | — | Magnesium sulfate | 100 |
| Example 11 | COF-1 | CLF-1 | 1% sodium carbonate aqueous solution | Magnesium sulfate | 100 | — | — |
| Example 12 | COF-1 | CLF-1 | 1% sodium carbonate aqueous solution | Calcium chloride | 100 | Calcium chloride | 100 |
| Example 13 | COF-1 | CLF-1 | 1% sodium carbonate aqueous solution | — | — | Calcium chloride | 100 |
| Example 14 | COF-1 | CLF-1 | 1% sodium carbonate aqueous solution | Calcium chloride | 100 | — | — |
| Example 15 | COF-4 | CLF-4 | 1% tetramethyl-ammonium hydroxide aqueous solution | Magnesium sulfate | 100 | Magnesium sulfate | 100 |
| Example 16 | COF-4 | CLF-4 | 1% tetramethyl-ammonium hydroxide aqueous solution | — | — | Magnesium sulfate | 100 |
| Example 17 | COF-4 | CLF-4 | 1% tetramethyl-ammonium hydroxide aqueous solution | Magnesium sulfate | 100 | — | — |
| Example 18 | COF-4 | CLF-4 | 1% tetramethyl-ammonium hydroxide aqueous solution | Calcium chloride | 100 | Calcium chloride | 100 |
| Example 19 | COF-4 | CLF-4 | 1% tetramethyl-ammonium hydroxide aqueous solution | — | — | Calcium chloride | 100 |
| Example 20 | COF-4 | CLF-4 | 1% tetramethyl-ammonium hydroxide aqueous solution | Calcium chloride | 100 | — | — |
| Comparative Example 5 | COF-1 | CLF-1 | 1% sodium carbonate aqueous solution | — | — | — | — |
| Comparative Example 6 | COF-1 | CLF-1 | 1% sodium carbonate aqueous solution | — | — | Sodium sulfate | 100 |
| Comparative Example 7 | COF-4 | CLF-4 | 1% tetramethyl-ammonium hydroxide aqueous solution | — | — | — | — |
| Comparative Example 7 | COF-4 | CLF-4 | 1% tetramethyl-ammonium hydroxide aqueous solution | — | — | Sodium sulfate | 100 |

High Temperature & High Humidity Test:

The optical waveguides (waveguide length: 10 cm) obtained in Examples 1 to 20 and Comparative Examples 1 to 8 were used to carry out a high temperature & high humidity leaving test at a temperature of 85° C. and a humidity of 85% for 1000 hours on conditions according to a JPCA standard (JPCA-PE02-05-01S) by means of a high temperature & high humidity tester (trade name: PL-2KT, manufactured by ESPEC Corp.).

The optical propagation losses of the optical waveguides after carrying out the high temperature & high humidity test were measured using the same light source, photosensitive sensor, incident fiber and output fiber as described above, and they were evaluated by the following criteria:
○: 0.3 dB/cm less
X: larger than 0.3 dB/cm Temperature Cycle Test:

The optical waveguides (waveguide length: 10 cm) obtained in Examples 1 to 20 and Comparative Examples 1 to 8 were subjected to a temperature cycle test in 1000 cycles at a temperature between −55° C. and 125° C. on conditions according to a JPCA standard (JPCA-PE02-05-01S) by means of a temperature cycle tester (trade name: ETAC WINTECH NT1010, manufactured by Kusumoto Chemicals, Ltd.). The detailed temperature cycle test conditions are shown in Table 5.

TABLE 5

|  |  | Temperature (° C.) | Time (minute) |
|---|---|---|---|
| 1 cycle | Step 1 | −55 | 15 |
|  | Step 2 | 125 | 15 |

The optical propagation losses of the optical waveguides after subjected to the temperature cycle test were measured using the same light source, photosensitive sensor, incident fiber and output fiber as described above, and they were evaluated by the following criteria:
○: 0.3 dB/cm less
X: larger than 0.3 dB/cm Reflow Test:

The optical waveguides (waveguide length: 10 cm) obtained in Examples 1 to 20 and Comparative Examples 1 to 8 were subjected three times to a reflow test at a maximum temperature of 265° C. on conditions according to IPC/JEDEC J-STD-020B by means of a reflow tester (trade name: Salamanda XNA-645PC, manufactured by Furukawa Electric Co., Ltd.). The detailed reflow conditions are shown in Table 6, and the temperature profile in a reflow furnace is shown in FIG. 1.

TABLE 6

| Zone number | 1 | 2 | 3 | 4 | 5 | 6 | 7 |
|---|---|---|---|---|---|---|---|
| Set temperature (° C.) of upper heater | 175 | 195 | 220 | 250 | 280 | 220 | 0 |
| Set temperature (° C.) of lower heater | 175 | 195 | 220 | 250 | 300 | 240 | — |
| Conveyor speed (cm/minute) |  |  |  | 60 |  |  |  |

The optical propagation losses of the optical waveguides after subjected to the reflow test were measured using the same light source, photosensitive sensor, incident fiber and output fiber as described above, and they were evaluated by the following criteria:
○: 0.3 dB/cm less
X: larger than 0.3 dB/cm The measurement results of the above optical propagation losses are shown in Table 7.

TABLE 7

|  |  | Example | | | | | | | | Comparative Example | | | |
|---|---|---|---|---|---|---|---|---|---|---|---|---|---|
| Initial |  | 1 | 2 | 3 | 4 | 5 | 6 | 7 | 8 | 1 | 2 | 3 | 4 |
| Optical propagation loss | After high temperature & high humidity test for 1000 hours | ○ | ○ | ○ | ○ | ○ | ○ | ○ | ○ | ○ | X | X | X |
|  | After temperature cycle test in 1000 cycles | ○ | ○ | ○ | ○ | ○ | ○ | ○ | ○ | X | X | X | X |
|  | After reflow test three times | ○ | ○ | ○ | ○ | ○ | ○ | ○ | ○ | X | X | X | X |

TABLE 8

|  |  | Example | | | | | | | | | | | | Comparative Example | | | |
|---|---|---|---|---|---|---|---|---|---|---|---|---|---|---|---|---|---|
| Initial |  | 9 | 10 | 11 | 12 | 13 | 14 | 15 | 16 | 17 | 18 | 19 | 20 | 5 | 6 | 7 | 8 |
| Optical propagation loss | After high temperature & high humidity test for 1000 hours | ○ | ○ | ○ | ○ | ○ | ○ | ○ | ○ | ○ | ○ | ○ | ○ | ○ | ○ | X | X |
|  | After temperature cycle test in 1000 cycles | ○ | ○ | ○ | ○ | ○ | ○ | ○ | ○ | ○ | ○ | ○ | ○ | X | X | X | X |
|  | After reflow test three times | ○ | ○ | ○ | ○ | ○ | ○ | ○ | ○ | ○ | ○ | ○ | ○ | X | X | X | X |

As shown in Table 7, it is apparent that the optical waveguides formed by the production process of the present invention are excellent in a transparency and a reliability. On the other hand, it is apparent that the optical waveguides formed by production processes for an optical waveguide which do not belong to the production process of the present invention, that is, the optical waveguides formed without being treated with a divalent or higher-valent metal ion during and/or after development or the optical waveguides formed without being washed with acid after development are inferior in a transparency and a reliability.

INDUSTRIAL APPLICABILITY

Use of the production process of the present invention makes it possible to effectively convert an instable monovalent salt remaining in a core pattern to a divalent or higher salt or makes it possible to effectively return an instable monovalent salt remaining in a core pattern to an acid functional group, and as a result thereof, an optical waveguide which is excellent in a transparency and a reliability can be obtained at a high productivity.

What is claimed is:

1. A production process for an optical waveguide comprising a step for forming a photosensitive resin layer comprising a photosensitive resin composition on a substrate, a step for exposing a desired pattern and a step for carrying out development in an alkaline developer containing a divalent or higher-valent metal ion,
wherein the photosensitive resin composition is a resin composition comprising (A) a carboxyl group-containing alkali-soluble polymer, (B) a polymerizable compound and (C) a photopolymerization initiator, the carboxyl group-containing alkali-soluble polymer (A) being a carboxyl group-containing alkali-soluble (meth) acryl polymer.

2. The production process for an optical waveguide as described in claim 1, wherein the divalent or higher-valent metal ion is magnesium and/or calcium.

3. The production process for an optical waveguide as described in claim 1, wherein the alkaline developer is an alkaline aqueous solution.

4. The production process for an optical waveguide as described in claim 1, wherein the alkaline developer is an alkaline quasi-aqueous developer comprising an alkaline aqueous solution and at least one organic solvent.

5. The production process for an optical waveguide as described in claim 1, wherein the photosensitive resin layer is formed by coating the photosensitive resin composition.

6. The production process for an optical waveguide as described in claim 1, wherein the photosensitive resin layer is formed by laminating a photosensitive resin film comprising a photosensitive resin composition.

7. The production process for an optical waveguide as described in claim 1, wherein the photosensitive resin composition is a resin composition comprising a compound having at least one of a carboxyl group and a phenolic hydroxyl group.

8. An optical waveguide obtained by the production process as described in claim 1.

9. The optical waveguide as described in claim 8, wherein an optical propagation loss is 0.3 dB/cm or less.

10. The optical waveguide as described in claim 8, wherein an optical propagation loss after carrying out a high temperature and high humidity leaving test at a temperature of 85° C. and a humidity of 85% for 1000 hours is 0.3 dB/cm or less.

11. The optical waveguide as described in claim 8, wherein an optical propagation loss after carrying out a temperature cycle test at a temperature between −55° C. and 125° C. in 1000 cycles is 0.3 dB/cm or less.

12. The optical waveguide as described in claim 8, wherein an optical propagation loss after carrying out three times a reflow test at a maximum temperature of 265° C. is 0.3 dB/cm or less.

13. A production process for an optical waveguide comprising a step for forming a photosensitive resin layer comprising a photosensitive resin composition on a substrate, the photosensitive resin composition including an alkali-soluble polymer, a step for exposing a desired pattern, a step for carrying out development in an alkaline developer and a step for carrying out washing with a cleaning liquid containing an acid aqueous solution.

14. The production process for an optical waveguide as described in claim 13, wherein a divalent or higher-valent metal ion is contained in the alkaline developer of the developing step.

15. The production process for an optical waveguide as described in claim 13, wherein the acid aqueous solution is an aqueous solution containing sulfuric acid.

16. The production process for an optical waveguide as described in claim 13, wherein a pH of the acid aqueous solution is more than 0 to 5.

17. The production process for an optical waveguide as described in claim 13, wherein the alkaline developer is an alkaline quasi-aqueous developer comprising an alkaline aqueous solution and at least one organic solvent.

18. The production process for an optical waveguide as described in claim 13, wherein the photosensitive resin layer is formed by laminating a photosensitive resin film comprising a photosensitive resin composition.

19. The production process for an optical waveguide as described in claim 13, wherein the photosensitive resin composition is a resin composition comprising (A) a carboxyl group-containing alkali-soluble polymer as the alkali-soluble polymer, (B) a polymerizable compound and (C) a photopolymerization initiator.

20. An optical waveguide obtained by the production process as described in claim 13.

21. The production process for an optical waveguide as described in claim 19, wherein the carboxyl group-containing alkali-soluble polymer (A) is a carboxyl group-containing alkali-soluble (meth)acryl polymer.

22. The production process for an optical waveguide as described in claim 13, wherein said step for carrying out washing with the cleaning liquid is performed after said step for carrying out development.

23. The production process for an optical waveguide as described in claim 13, wherein said step for carrying out development forms a patterned photosensitive resin layer, and said step for carrying out washing washes said patterned photosensitive resin layer.

24. The production process for an optical waveguide as described in claim 13, wherein said alkali-soluble polymer, of the photosensitive resin composition, is an alkali-soluble polymer having at least one of a carboxyl group and a phenolic hydroxyl group.

25. The production process for an optical waveguide as described in claim 13, wherein said desired pattern is a pattern of a core part of said optical waveguide.

26. A production process for an optical waveguide comprising a step for forming a photosensitive resin layer comprising a photosensitive resin composition on a substrate, a step for exposing a desired pattern, a step for carrying out development in an alkaline developer and a step for carrying out washing with a cleaning liquid containing a divalent or higher-valent metal ion or an acid aqueous solution, wherein the photosensitive resin composition is a resin composition comprising (A) a carboxyl group-containing alkali-soluble polymer, (B) a polymerizable compound and (C) a photopolymerization initiator, and the carboxyl group-containing alkali-soluble polymer (A) is a carboxyl group-containing alkali-soluble (meth) acryl polymer.

27. The production process for an optical waveguide as described in claim 26, wherein a divalent or higher-valent metal ion is contained in the alkaline developer of the developing step.

* * * * *